(12) United States Patent
Park

(10) Patent No.: US 10,998,521 B2
(45) Date of Patent: May 4, 2021

(54) ELECTRONIC PANEL AND METHOD OF MANUFACTURING THE SAME

(71) Applicant: Samsung Display Co., Ltd., Yongin-Si (KR)

(72) Inventor: Sungkyun Park, Hwaseong-si (KR)

(73) Assignee: SAMSUNG DISPLAY CO., LTD.

( * ) Notice: Subject to any disclaimer, the term of this patent is extended or adjusted under 35 U.S.C. 154(b) by 0 days.

(21) Appl. No.: 15/980,782

(22) Filed: May 16, 2018

(65) Prior Publication Data

US 2019/0097171 A1    Mar. 28, 2019

(30) Foreign Application Priority Data

Sep. 22, 2017    (KR) .................. 10-2017-0122832

(51) Int. Cl.
| | |
|---|---|
| *H01L 27/32* | (2006.01) |
| *H01L 51/52* | (2006.01) |
| *H01L 51/00* | (2006.01) |
| *G06F 3/041* | (2006.01) |
| *H05K 1/02* | (2006.01) |
| *H01L 51/56* | (2006.01) |
| *H05K 1/18* | (2006.01) |

(52) U.S. Cl.
CPC ........ *H01L 51/5253* (2013.01); *G06F 3/0412* (2013.01); *H01L 27/323* (2013.01); *H01L 27/3276* (2013.01); *H01L 51/0097* (2013.01); *H01L 51/56* (2013.01); *H05K 1/028* (2013.01); *H01L 51/5203* (2013.01); *H01L 2251/5338* (2013.01); *H05K 1/189* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 9,318,427 B2 | 4/2016 | Youn et al. | |
| 10,497,896 B2* | 12/2019 | Lee | ............ H01L 51/5253 |
| 2014/0217373 A1 | 8/2014 | Youn et al. | |
| 2017/0147116 A1 | 5/2017 | Lee et al. | |
| 2018/0182821 A1* | 6/2018 | Yun | ............ H01L 27/3276 |
| 2018/0188866 A1* | 7/2018 | Heo | ............ G06F 3/0445 |
| 2018/0331160 A1* | 11/2018 | Beak | ............ G06F 3/0446 |

(Continued)

FOREIGN PATENT DOCUMENTS

| | | |
|---|---|---|
| CN | 106547405 | 3/2017 |
| KR | 10-2014-0099164 | 8/2014 |

(Continued)

*Primary Examiner* — Grant S Withers
(74) *Attorney, Agent, or Firm* — H.C. Park & Associates, PLC

(57) ABSTRACT

An electronic device includes an electronic panel having an active area and a pad area, the electronic panel including a sensing unit responsive to external input, and a circuit board connected to the electronic panel in the pad area, in which the electronic panel includes a first conductive layer disposed on the active area, a second conductive layer disposed on the first conductive layer, an organic insulation layer disposed between the first conductive layer and the second conductive layer, and an inorganic insulation layer covering a first surface of the organic insulation layer and exposing a first surface of the second conductive layer.

14 Claims, 21 Drawing Sheets

(56) References Cited

U.S. PATENT DOCUMENTS

2019/0004654 A1\* 1/2019 Gwon .................... G06F 3/044
2019/0095007 A1\* 3/2019 Jeong .................... G06F 1/1626
2019/0369788 A1\* 12/2019 Tada et al. ............ G06F 3/0412

FOREIGN PATENT DOCUMENTS

KR 10-2016-0055013 5/2016
KR 10-2017-0001935 1/2017

\* cited by examiner

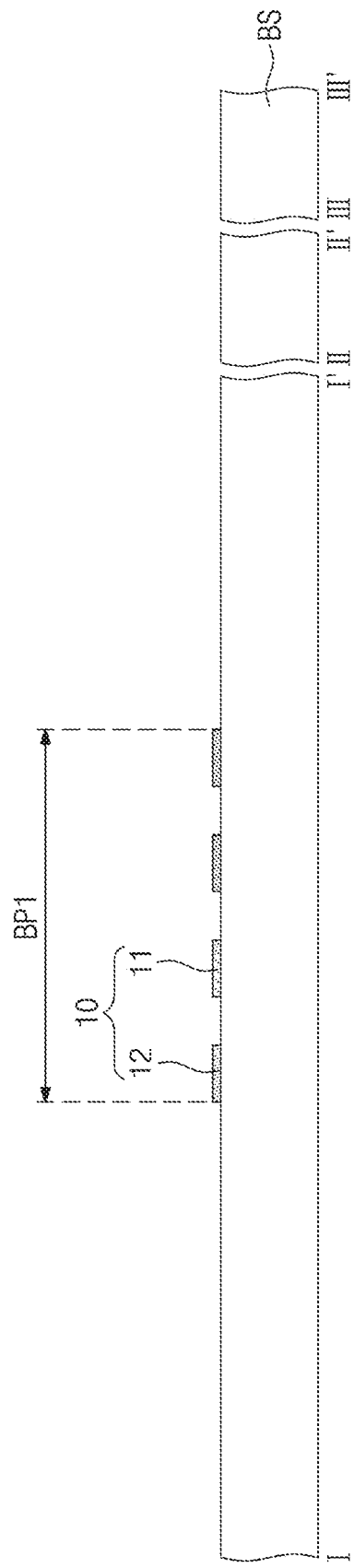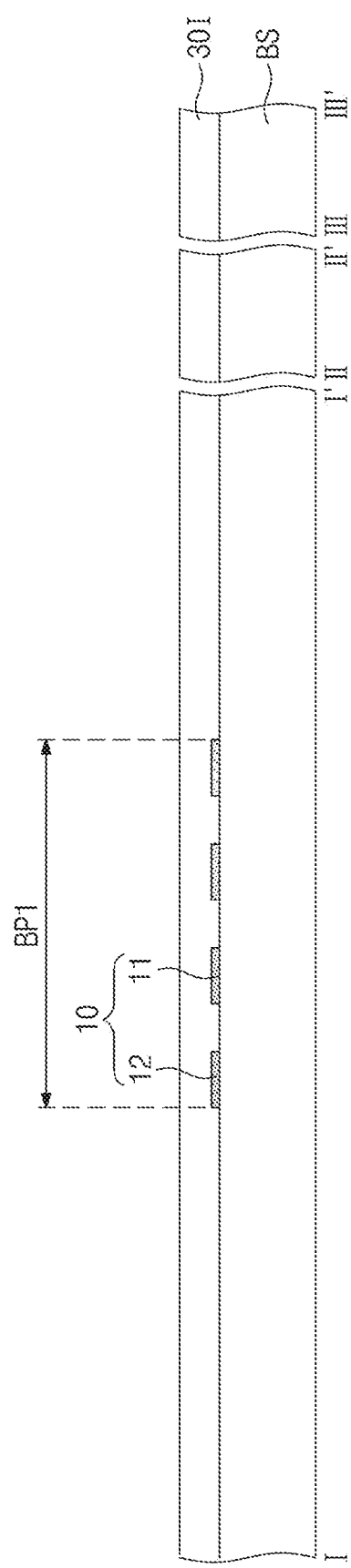

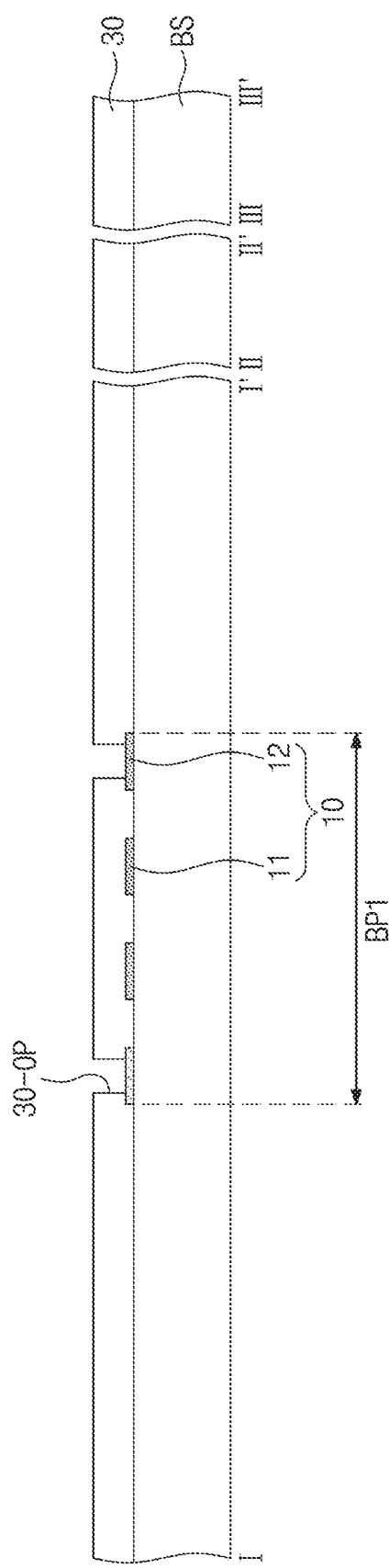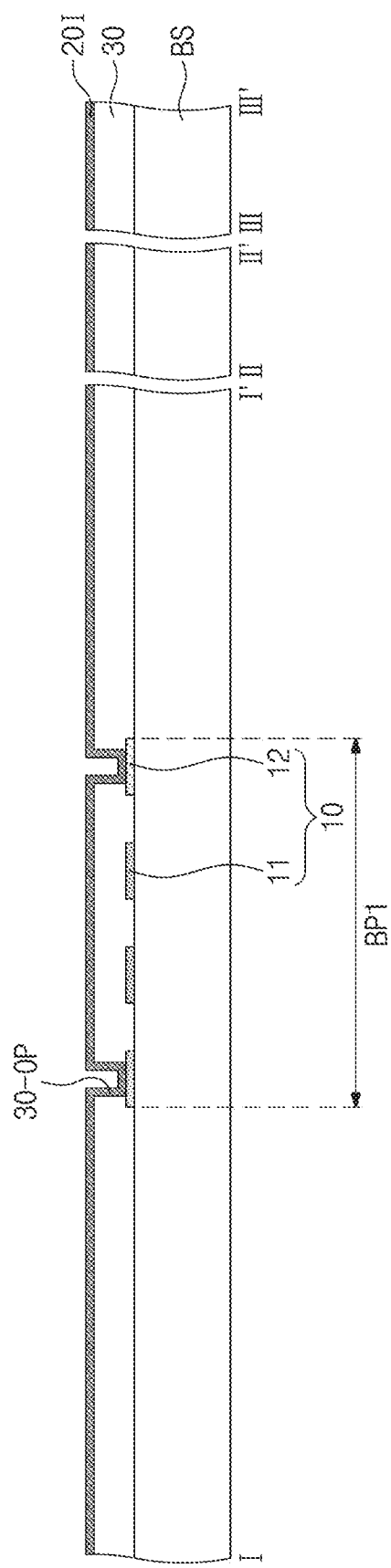

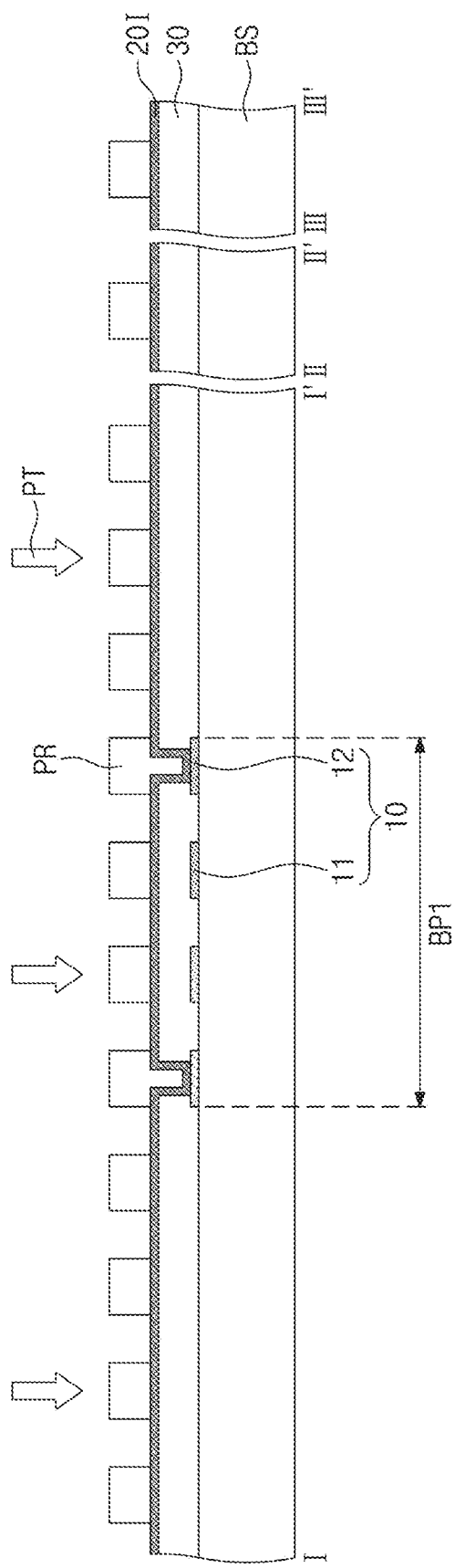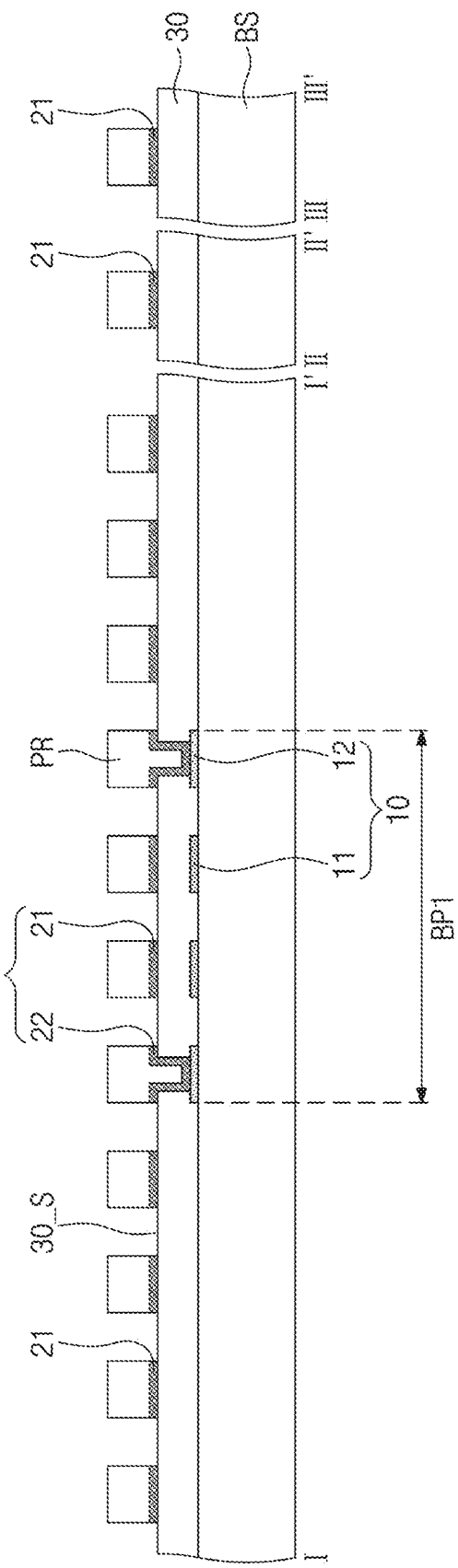

ELECTRONIC PANEL AND METHOD OF MANUFACTURING THE SAME

CROSS-REFERENCE TO RELATED APPLICATION

This application claims priority from and the benefit of Korean Patent Application No. 10-2017-0122832, filed on Sep. 22, 2017, which is hereby incorporated by reference for all purposes as if fully set forth herein.

BACKGROUND

Field

Exemplary embodiments of the invention relate generally to an electronic panel and a method of manufacturing the same, and, more specifically, to an electronic panel having improved process reliability and a method of manufacturing the same.

Discussion of the Background

An electronic device may be activated by receiving an electric signal. The electronic device may include an electronic panel for detecting various types of inputs applied from the outside. The electronic panel may be used as a stand alone unit or with a display unit displaying an image.

An electronic device may include various electrode patterns that allow the electronic device to be activated by an electric signal. An area of the activated electrode patterns may display information or respond to a touch applied from the outside.

Such electronic devices may include flexible or bendable display panels, which require that the electrodes activated by an external touch input also be flexible or bendable.

The above information disclosed in this Background section is only for understanding of the background of the inventive concepts, and, therefore, it may contain information that does not constitute prior art.

SUMMARY

Applicant discovered that components of flexible or bendable electronic display device, such as the insulating layer for the touch electrode patterns, may be made of organic material to facilitate flexibility. However, organic material is more easily damaged during manufacture, such as be chemical etching, than inorganic materials.

Devices constructed according to exemplary embodiments of the invention include an electronic panel having a structure capable of improving the chemical resistance of an organic insulation layer. In addition, a method of manufacturing an electronic panel according to exemplary embodiments of the invention may have improved process reliability by preventing an organic insulation layer from being damaged.

Additional features of the inventive concepts will be set forth in the description which follows, and in part will be apparent from the description, or may be learned by practice of the inventive concepts.

According to an exemplary embodiment, an electronic device includes an electronic panel having an active area and a pad area, the electronic panel including a sensing unit responsive to external input, and a circuit board connected to the electronic panel in the pad area. The electronic panel includes a first conductive layer disposed on the active area, a second conductive layer disposed on the first conductive layer, an organic insulation layer disposed between the first conductive layer and the second conductive layer, and an inorganic insulation layer covering a first surface of the organic insulation layer and exposing a first surface of the second conductive layer.

The first conductive layer may include a plurality of first conductive patterns, the second conductive layer may include a plurality of second conductive patterns including a first pattern disposed on the organic insulation layer, and a second pattern passing through the organic insulation layer and connected to the first conductive layer. The first pattern of the second conductive layer may be spaced apart from the first conductive patterns, the second pattern of the second conductive layer may be connected to one of the first conductive patterns, and the inorganic insulation layer may expose a first surface of the first pattern and a first surface of the second pattern.

The first surface of the organic insulation layer may be a top surface thereof and the first surface of the second conductive layer may be a top surface thereof.

The first and second conductive layers may include mesh lines having openings exposing the organic insulation layer, and the inorganic insulation layer may expose a first surface of the mesh lines and covers first surfaces of the organic insulation layer exposed by the openings.

The inorganic insulation layer may have a thickness less than that of the organic insulation layer.

The inorganic insulation layer may have a thickness equal to or less than that of the second conductive layer, and the inorganic insulation layer may have a thickness equal to or less than about 500 Å.

The organic insulation layer may be directly disposed on the top surface of the second conductive layer.

The electronic panel may further include a sensing electrode including a plurality of sensor patterns disposed in the active area, and a plurality of connecting patterns disposed on a layer different from those of the sensor patterns with the organic insulation layer disposed therebetween.

The first conductive layer may include the connecting patterns, the second conductive layer may include the sensor patterns, the connecting patterns may pass through the organic insulation layer and are connected to the sensor patterns, and the connecting patterns may be exposed from the inorganic insulation layer.

The first conductive layer may include the sensor patterns, the second conductive layer may include the connecting patterns, the sensor patterns may pass through the organic insulation layer and connected to the connecting patterns, and the sensor patterns may be exposed through the inorganic insulation layer.

The second conductive layer may further include a pad pattern disposed on the pad area and connected to the sensing electrode, and the pad pattern may be exposed by the inorganic insulation layer.

The first conductive layer may further include a lower pattern disposed on the pad area, the second conductive layer may further include an upper pattern disposed on the pad area, passing through the organic insulation layer, and connected to the lower pattern, the sensing electrode may be connected to at least one of the upper pattern and the lower pattern, and the inorganic insulation layer may expose the upper pattern.

The electronic panel may further include a protective layer disposed on the inorganic insulation layer covering the second conductive layer, and the protective layer may cover substantially the entire active area and exposes at least a portion of the pad area.

According to another exemplary embodiment, an electronic panel includes a display unit configured to display an image, and a sensing unit disposed on the display unit and configured to detect an external input, in which the sensing unit includes a plurality of first sensor patterns, a plurality of first connecting patterns connecting adjacent first ones of the sensor patterns to each other, a plurality of second sensor patterns insulated from the first sensor patterns, a plurality of second connecting patterns connecting adjacent ones of the second sensor patterns to each other, an organic insulation layer disposed between the first connecting patterns and the second connecting patterns, and an inorganic insulation layer covering a first surface of the organic insulation layer and exposing a surface of a conductive pattern disposed on the organic insulation layer.

The conductive pattern disposed on the organic insulation layer may include the first sensor patterns, the second sensor patterns, and the second connecting patterns, and the first connecting patterns may be disposed between the organic insulation layer and the display unit.

At least some of the first sensor patterns, the second sensor patterns, the first connecting patterns, and the second connecting patterns may include mesh lines having a plurality of openings, and the inorganic insulation layer may expose a surface of the mesh lines and fills the openings.

The display unit may include a plurality of organic light emitting elements and an encapsulation layer covering the organic light emitting elements, and the organic insulation layer may be directly disposed on the encapsulation layer.

According to yet another exemplary embodiment, a method of manufacturing an electronic panel includes the steps of forming first conductive patterns, forming a first insulation layer covering the first conductive patterns, forming a conductive layer on the first insulation layer, forming a photoresist pattern on the conductive layer, patterning the conductive layer to form second conductive patterns, forming an inorganic layer covering the photoresist pattern, and removing the photoresist pattern and a portion of the inorganic layer covering the photoresist pattern to form a second insulation layer.

The method may further include exposing the photoresist pattern to a chemical solution after forming of the inorganic layer and before removing of the photoresist pattern.

The step of forming a photoresist pattern may include forming the photoresist pattern to have a tapered side surface and a bottom surface contacting the conductive layer, the bottom surface having a surface area less than that of a top surface of the photoresist pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 8A, FIG. 8B, FIG. 8C, FIG. 8D, FIG. 8E, FIG. 8F, FIG. 8G, FIG. 8H, FIG. 8I, and FIG. 8J are cross-sectional views illustrating an exemplary method of manufacturing an electronic panel according to the principles of the invention.

DETAILED DESCRIPTION

Figure 1A:
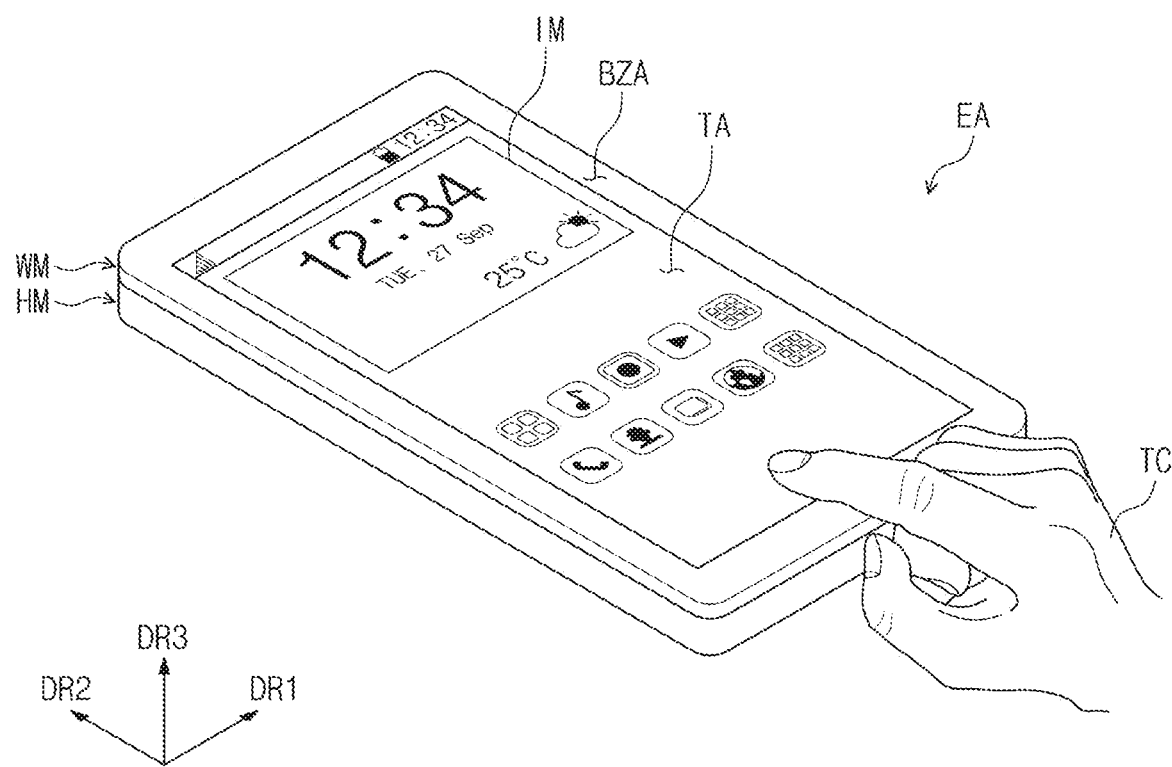
FIG. 1A is a perspective view of an exemplary embodiment of an electronic device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
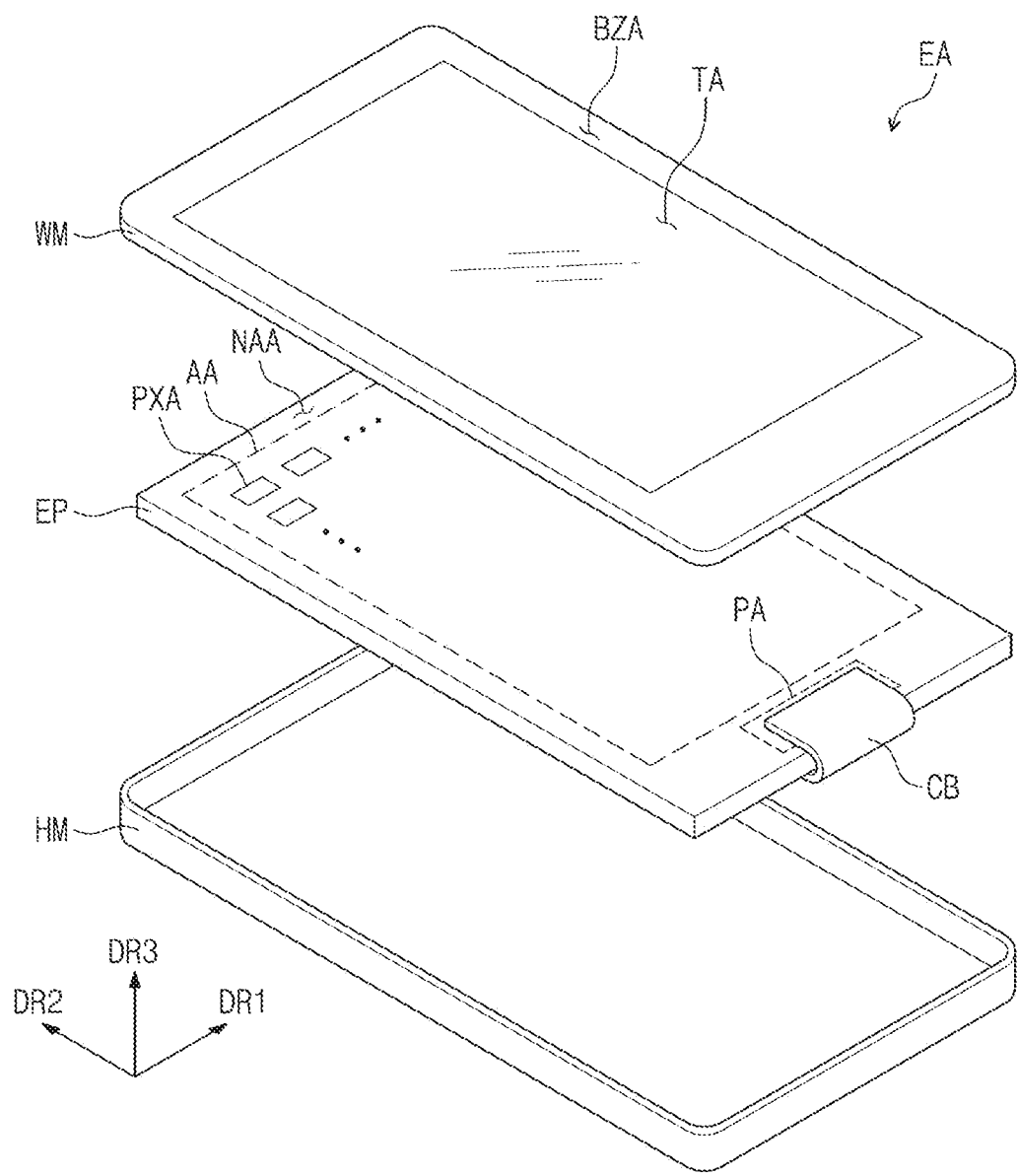
FIG. 1B is an exploded perspective view of the display device of FIG. 1A.

FIG. 1A is a perspective view of an exemplary embodiment of an electronic device constructed according to the principles of the invention. FIG. 1B is an exploded perspective view of the display device of FIG. 1A. Hereinafter, the electronic device according to an exemplary embodiment of the invention will be described with reference to FIGS. 1A and 1B.

As illustrated in FIG. 1A, an electronic device EA may be activated according to an electric signal. The electronic device EA may be a tablet, a notebook, a computer, a smart television, and the like. Hereinafter, the electronic device EA according will be described as a smart phone as an example.

The electronic device EA may have a substantially hexahedral shape in a first direction DR1 and a second direction DR2, which intersect each other, with a thickness extending in a third direction DR3. However, the inventive concepts are not limited thereto, and the shape of the electronic device EA may be varied as desired.

According to the illustrated embodiment, the electronic device EA is substantially parallel to each of the first direction DR1 and the second direction DR2, and includes a display surface for displaying an image IM. The display surface on which an image is displayed may correspond to a front surface of the electronic device EA.

The front surface of the electronic device EA may be divided into a transmission area TA and a bezel area BZA. The transmission area TA may be an area on which the image IM is displayed. A user may see the image IM through the transmission area TA.

The bezel area BZA is disposed adjacent to the transmission area TA. The bezel area BZA may have a predetermined color. The shape of the transmission area TA may be substantially defined by the bezel area BA.

As used herein, a front surface (or top surface) and a rear surface (or bottom surface) of each member are defined based on the direction in which the image IM is displayed. More particularly, the front surface and the rear surface may face each other in the third direction DR3, which is a direction normal to each of the front surface and the rear surface.

The directions respectively indicated by the first to third directions DR1 to DR3 may be relative and may be converted into other directions. Hereinafter, first to third directions are respectively indicated by the first to third directional axes DR1, DR2, and DR3.

The electronic device EA may detect a touch TC applied from the outside. The touch TC may include various types of inputs provided from the outside. For example, the touch TC may be provided in various types of external inputs, such as a portion of a user's body, light, heat, or pressure. The electronic device EA may also detect the touch TC adjacent to or close to the electronic device EA in addition to the touch TC contacting the electronic device EA.

The electronic device EA may detect the touch applied to the transmission area TA, and may not detect the touch applied to the bezel area BZA. Alternatively, the electronic device EA may detect the touch TC applied to the bezel area BZA, and may not detect the touch TC applied to the transmission area TA. Also, the electronic device EA may detect the touch TC applied to the front surface of the electronic device EA including the transmission area TA and the bezel area BZA. Although the electronic device EA is described as detecting the touch TC applied to various areas according to its internal constitution design, the inventive concepts are not limited thereto. In FIG. 1A, the touch TC will be described as a touch from a user's hand. Referring to FIG. 1B, the electronic device EA may include an electronic panel EP, a circuit board CB, a window member WM, and a housing member HM. The housing member HM, the electronic panel EP, the circuit board CB, and the window member WM may be stacked and assembled in the third direction DR3.

While FIG. 1B selectively illustrate some components of the electronic device EA, the electronic device EA may further include various components known in the art, such as a power supply module, an optical member, a protection member, a heat dissipation member, and an electronic module including electronic elements, in addition to the electronic panel EP, the circuit board CB, and the window member WM.

The electronic panel EP may be divided into an active area AA, a pad area PA, and a peripheral area NAA on a plane. The active area AA may detect the touch TC. A plurality of sensing electrodes for detecting the touch TC may be disposed on the active area AA, which will be described in detail later.

As described above, the active area AA displays the image IM. Accordingly, the active area AA may include a plurality of light emitting areas PXA through which light generating the image IM is displayed. The light emitting areas PXA may be arranged in the active area AA in a matrix form. A pixel may be disposed on each of the light emitting areas PXA. The pixel displays light according to an electric signal, which will be described in detail later.

The pad area PA may be disposed adjacent to one side of the active area AA. The pad area PA may be connected to the circuit board CB. The electronic panel EP may be electrically connected to an external element through the pad area PA.

Although FIG. 1B shows a single pad area PA, however, the inventive concepts are not limited thereto. For example, the electronic panel EP may include a plurality of pad areas. Also, a plurality of electric signals different from each other may be applied to the single pad area PA, or electric signals different from each other may be applied to the plurality of pad areas, respectively.

In addition, the plurality of pad areas may be provided on different layers or on the same layer. Although the electronic panel EP may include various kinds of pad areas PA, the inventive concepts are not limited thereto. According to the illustrated embodiment, the pad area PA transmits or receives a signal detecting the touch TC, which will be described in detail later.

The peripheral area NAA is disposed adjacent to the active area AA and the pad area PA. The peripheral area NAA may surround each of the active area AA and the pad area PA.

One side of the circuit board CB may overlap the pad area PA. The circuit board CB may provide an electric signal to the electronic panel EP or receive an electric signal generated from the electronic panel EP. The electric signal may include an alternating current signal or a direct current signal.

The circuit board CB may include a plurality of signal wires. Each of the signal wires may be connected to the pad area PA, the circuit board CB may further include an electronic element, such as an integrated circuit.

The window member WM is disposed on a front surface of the electronic panel EP. The window member WM provides a front surface of the electronic device EA and protects the electronic panel EP. For example, the window member WM may include a glass substrate, a sapphire substrate, or a plastic film. The window member WM may have a multi-layer or a single-layer structure. For example, the window member WM may have a lamination structure, such as a plurality of plastic films coupled by an adhesive or a glass substrate and a plastic film coupled by an adhesive.

The window member WM defines the front surface of the electronic device EA. The transmission area TA and the bezel area BZA may be included in the window member WM. The transmission area TA may be optically transparent. The transmission area TA may transmit is light displayed in the active area AA. For example, the transmission area TA overlaps an entire surface or at least a portion of the active area AA. The image IM displayed on the active area AA of the electronic panel EP may be seen from the outside through the transmission area TA.

The bezel area BZA may cover the peripheral area NAA and the pad area PA of the electronic panel EP to block areas, except for the active area AA, from being seen from the outside. According to an exemplary embodiment, the bezel area BZA may be omitted.

The housing member HM is disposed on a rear surface of the electronic panel EP. The housing member HM may be coupled to the window member WM to provide the rear surface of the electronic device EA. The housing member HM is coupled to the window member WM to define an inner space and accommodate the electronic panel EP, the circuit board CB, and various electronic components or optical components in the inner space.

The housing member HM may include a material having a relatively high rigidity. For example, the housing member HM may include a plurality of frames and/or plates made of glass, plastic, and metal. The housing member HM may stably protect components of the electronic device EA, which are accommodated in the inner space, from an external shock.

Figure 2A:
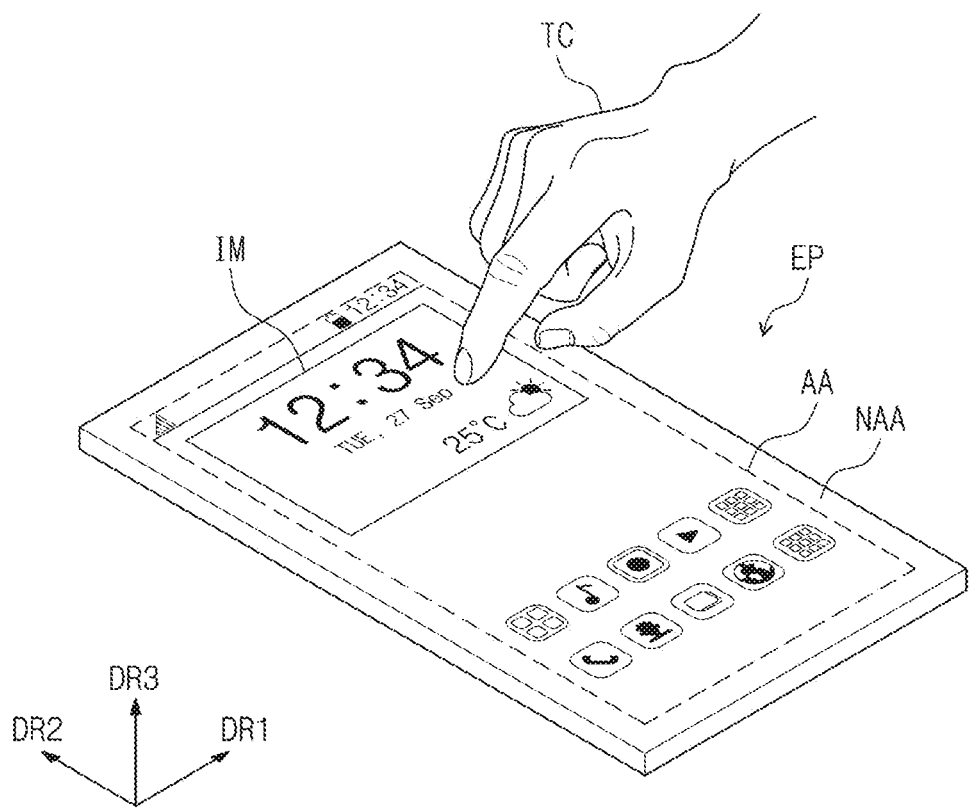
FIG. 2A, FIG. 2B, and FIG. 2C are perspective views of an exemplary embodiment of an electronic panel constructed according to the principles of the invention.
Figure 2B:
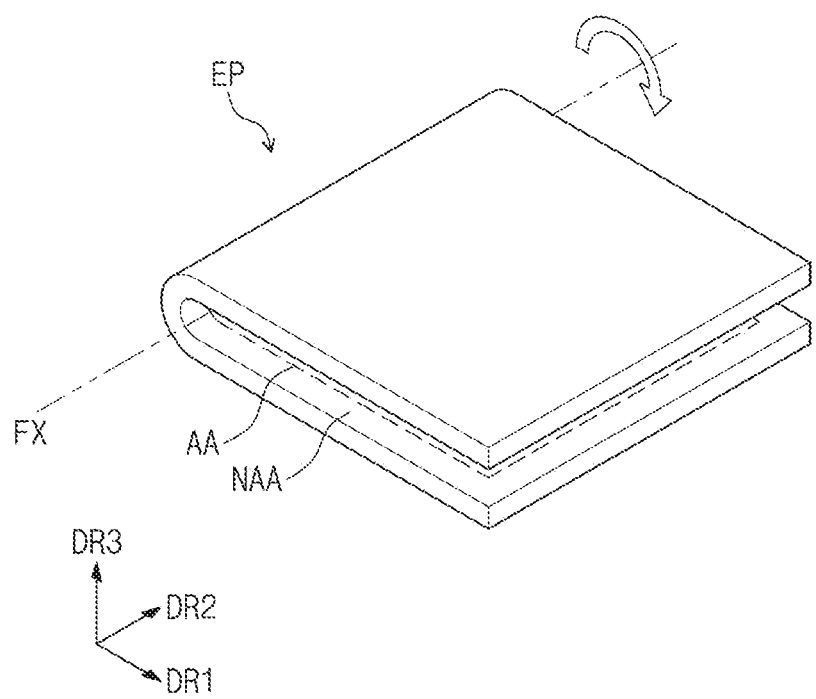
Figure 2C:
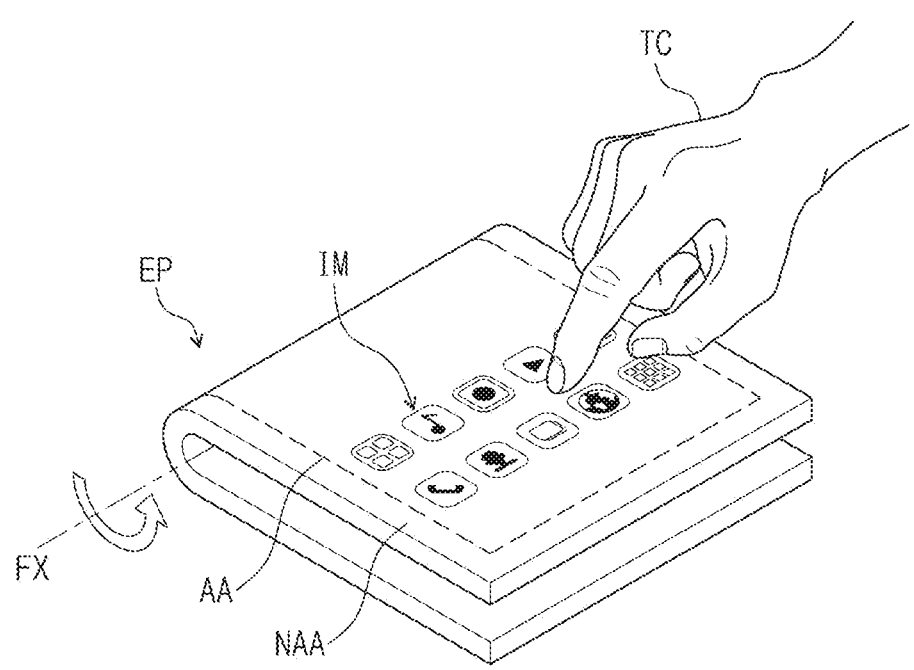

FIGS. 2A to 2C are perspective views of an electronic panel according to an exemplary embodiment of the invention. FIGS. 2A to 2C are perspective views illustrating various states of the electronic panel EP according to various operations. In FIGS. 2A to 2C, the pad area PA is omitted for convenience of description.

The electronic panel EP according to an exemplary embodiment may be flexible. As illustrated in FIGS. 2A to 2C, the electronic panel EP may be folded in various directions with respect to a folding axis FX.

FIG. 2A illustrates the electronic panel EP in an unfolded position, whereas, FIG. 2B illustrates the electronic panel EP in an inwardly folded position in which the active area faces inwardly, and FIG. 2C illustrates the electronic panel EP in an outwardly folded position in which the active area faces outwardly.

As illustrated in FIG. 2A, in the unfolding position, an entire surface of the active area AA of the electronic panel EP is unfolded to face the third direction DR3. As described above, the electronic panel EP provides the active area AA and the peripheral area NAA. The active area AA may display the image IM and detect the touch TC at the same time.

Referring to FIG. 2B, the electronic panel EP may be deformed into the inwardly folded position such that the electronic panel EP is folded to surround the active area AA. Accordingly, the electronic panel EP in the inwardly folded position may protect the active area AA from the outside.

Referring to FIG. 2C, the electronic panel EP may be deformed into the outwardly folded position such that the electronic panel EP exposes at least a portion of the active area AA in the third direction DR3. Accordingly, the electronic panel EP may detect the external touch TC even in the outwardly folded position.

According to an exemplary embodiment of the invention, the electronic panel EP may flexible so as to be deformed into various shapes in response to a force applied from the outside. Accordingly, the electronic panel EP may be stably accommodated in the housing member HM (refer to FIG. 1B) having various shapes and provide various usage environments to a user through deformation of its shape during usage.

Figure 3:
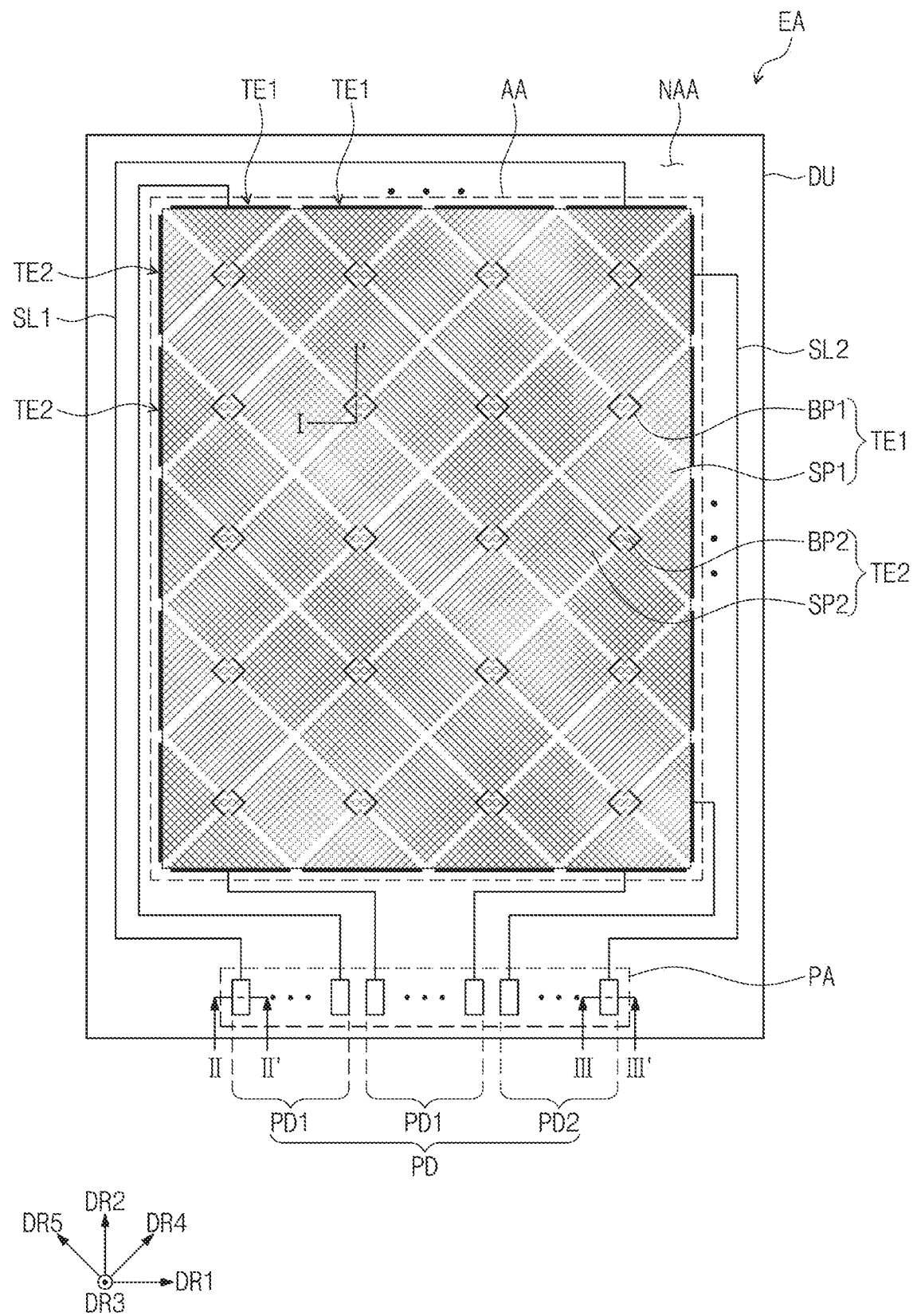
FIG. 3 is a schematic plan view of an electronic panel according to another exemplary embodiment of the invention.
Figure 4A:
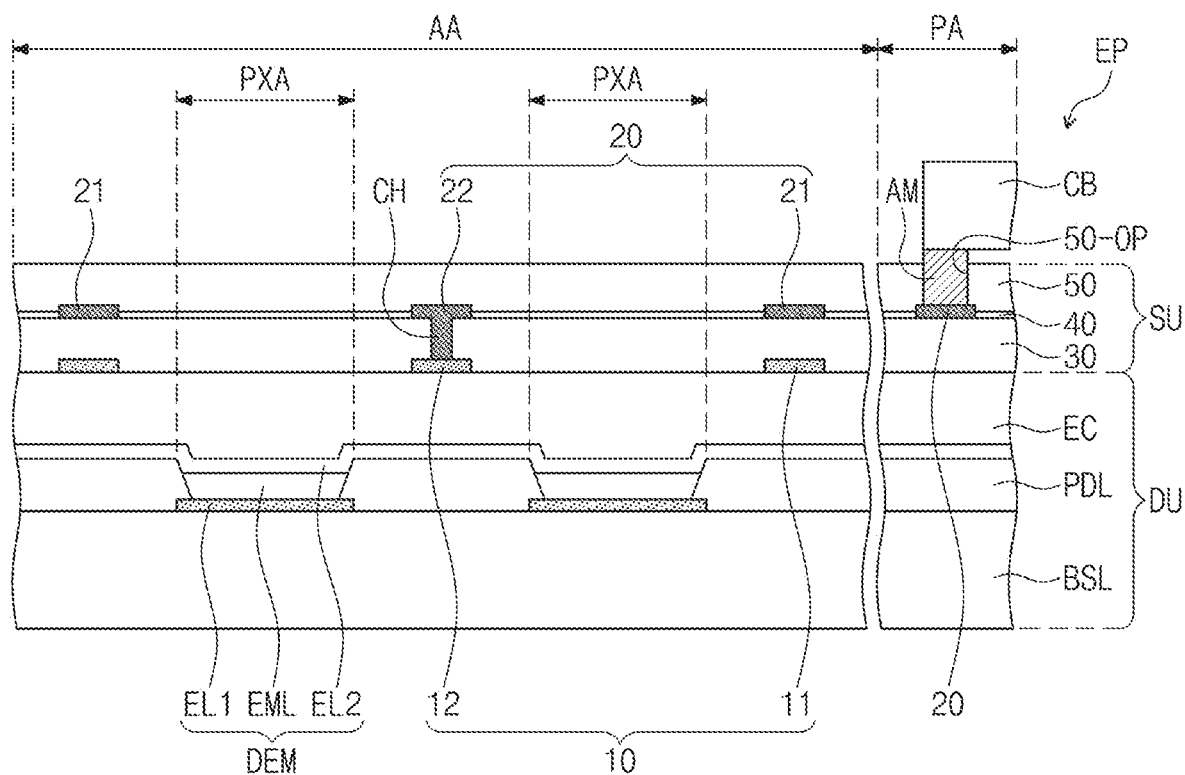
FIG. 4A is a cross-sectional view illustrating a partial area of the electronic panel of FIG. 3.
Figure 4B:
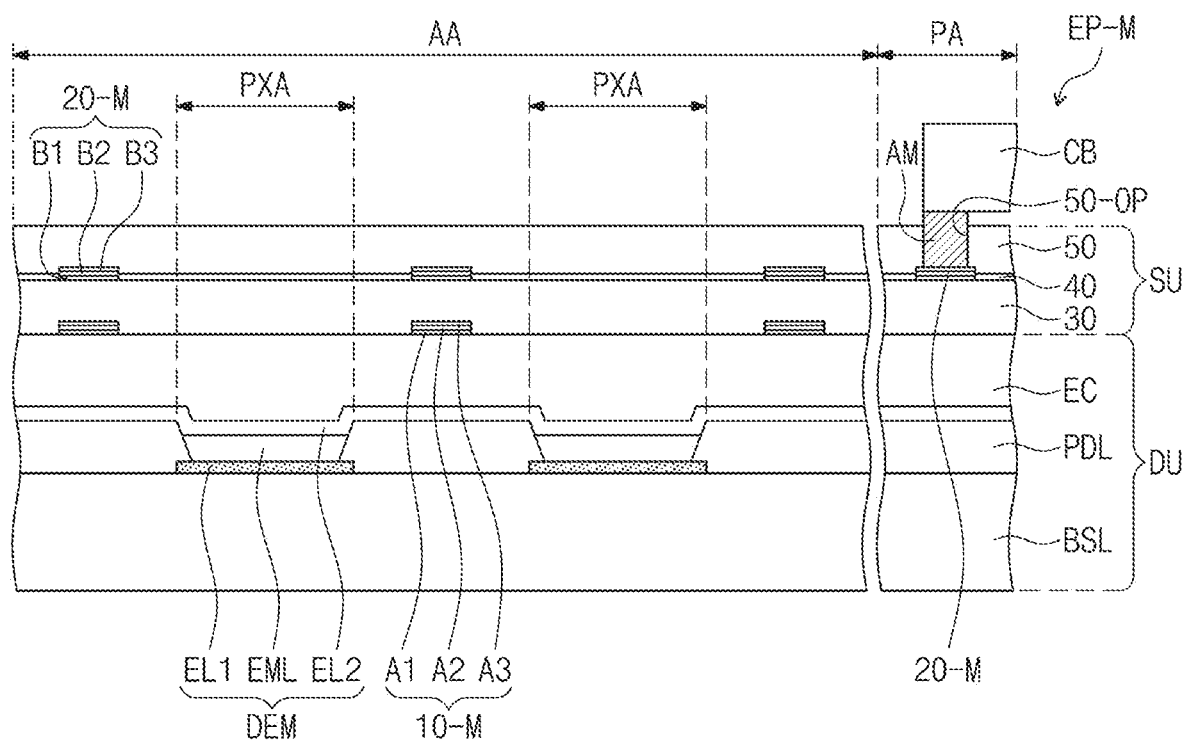
FIG. 4B is a cross-sectional view illustrating a partial area of an electronic panel according to an exemplary embodiment of the invention.

FIG. 3 is a schematic plan view of an electronic panel according to an exemplary embodiment of the invention. FIG. 4A is a cross-sectional view illustrating a partial area of the electronic panel in FIG. 3. FIG. 4B is a cross-sectional view illustrating a partial area of an electronic panel according to an exemplary embodiment of the invention.

FIG. 4A illustrates a partial area of the active area AA according to an exemplary embodiment, and FIG. 4B illustrates a partial area of the active area AA according to another exemplary embodiment.

As illustrated in FIGS. 3 and 4A, the electronic panel EP includes a display unit DU and an input sensing unit SU. According to the illustrated embodiment, the input sensing unit SU is disposed on the display unit DU, however, the inventive concepts are not limited thereto. For example, the input sensing unit SU may be disposed below the display unit DU or inserted into the display unit DU.

Referring to FIG. 4A, the display unit DU may include a base layer BSL, a pixel defining layer PDL, a display element DEM, and an encapsulation layer EC. The display unit DU may include multiple light emitting areas PXA arranged in the active area AA. FIG. 4A illustrates an area in which two light emitting areas PXA of the light emitting areas PXA are disposed.

The base layer BSL may include a plurality of insulation layers and a plurality of conductive layers. The conductive layers and the insulation layers may form a thin-film transistor and a capacitor, which are connected to the display element DEM.

The pixel defining layer PDL is disposed on the base layer BSL. Predetermined openings are defined in the pixel defining layer PDL. The openings may define the light emitting areas PXA, respectively.

The display element DEM is disposed on the base layer BSL. The display element DEM may be disposed in each of the openings. The display element DEM may display light according to an electric signal transmitted through the thin-film transistor and the capacitor to realize an image.

The display element DEM may include various elements. For example, the display element DEM may include an electrophoretic element, a liquid crystal capacitor, an electrowetting element, or an organic light emitting diode. In the illustrated embodiment, the display element DEM will be described as an organic light emitting diode as an example.

The display element DEM includes a first electrode EL1, a light emitting layer EML, and a second electrode EL2. The display element DEM may activate the light emitting layer EML according to a potential difference between the first electrode EL1 and the second electrode EL2 to generate light. Accordingly, the light emitting areas PXA may correspond to areas on which the light emitting layers EML are disposed.

The light emitting areas PXA may have sizes different from each other. For example, each of the light emitting areas PXA may have a different size according to a color of light emitted therefrom. As the light emitting area has a size suitable for a respective colors, various colors may be realized with uniform light efficiency.

The encapsulation layer EC covers the display element DEM. The encapsulation layer EC may include at least one inorganic layer and/or one organic layer. The encapsulation layer EC prevents external moisture from being introduced into the display element DEM and protects the display element DEM. Also, the encapsulation layer EC may be disposed between the display element DEM and the input sensing unit SU to electrically separate the display element DEM from the input sensing unit SU.

The input sensing unit SU may be directly disposed on the encapsulation layer EC. More particularly, the input sensing unit SU may be deposited or patterned on a top surface of the encapsulation layer EC. However, the inventive concepts are not limited thereto. For example, the electronic device EA may further include a member, such as a color filter or a buffer layer between the input sensing unit SU and the encapsulation layer EC.

Referring back to FIG. 3, the input sensing unit SU may include a first sensing electrode TE1, a second sensing electrode TE2, a first signal line SL1, a second signal line SL2, and a pad PD, which are arranged on a plane. The conductive patterns each include a first sensing electrode TE1, a second sensing electrode TE2, a first signal line SL1, a second signal line SL2, and the pad PD.

The first sensing electrode TE1 extends in the second direction DR2. The first sensing electrode TE1 is provided in plurality and arranged in the first direction DR1. The first sensing electrode TE1 includes a plurality of first sensor patterns SP1 arranged in the second direction DR2 and first connecting patterns BP1 disposed between the first sensor patterns SP1 to connect adjacent first sensor patterns SP1 to each other.

The second sensing electrode TE2 may be disposed to be insulated from the first sensing electrode TE1. The second electrode TE2 extends in the second direction DR2. The second sensing electrode TE2 is provided in plurality and arranged in the second direction DR2. The second sensing electrode TE2 includes a plurality of second sensor patterns SP2 arranged in the first direction DR1 and second connecting patterns BP2 disposed between the second sensor patterns SP2 to connect adjacent second sensor patterns SP2 to each other.

The input sensing unit SU may detect variance in mutual capacitance formed between the first sensing electrode TE1 and the second sensing electrode TE2 to detect the external touch TC (refer to FIG. 1A), or detect variance in capacitance of each of the first and second sensing electrodes TE1 and TE2 to detect the external touch TC.

The first signal line SL1 is connected to the first sensing electrode TE1. The first signal line SL1 may be disposed on the peripheral area NAA and may not be seen from the outside. The second signal line SL2 is connected to the second sensing electrode TE2. The second signal line SL2 may be disposed on the peripheral area NAA and may not be seen from the outside.

According to the illustrated embodiment, one first sensing electrode TE1 may be connected to two first signal lines SL1. Opposing ends of the first sensing electrode TE1 may be respectively connected to one of the first signal lines SL1, and are connected to two first pads, respectively. Accordingly, although the length of the first sensing electrode TE1 is relatively greater than that of the second sensing electrode TE2, the electric signal may be uniformly applied over the entire area. Accordingly, the input sensing unit SU may provide a uniform touch sensing environment over the entire active area AA regardless of its shape.

The second sensing electrode TE2 may be connected to two signal lines, or each of the first sensing electrode TE1 and the second sensing electrode TE1 may be connected to only one signal line.

The pads PD may include a first pad PD1 and a second pad PD2. As described above, as each of the pads PD may be connected to the first signal line SL1 or the second signal line SL2, each of the pads PD may be electrically connected by one of the signal lines to the first sensing electrode TE1 or the second sensing electrode TE2. As the external terminal provided through the circuit board CB (refer to FIG. 1B) or the like is connected to the pads PD, the external terminal may electrically connect the input sensing unit SU to an external component.

Referring to FIG. 4A, the input sensing unit SU may include a plurality of conductive patterns and a plurality of insulation layers, which are laminated to each other. The conductive patterns may include a first conductive layer 10 and a second conductive layer 20, which are disposed on layers different from each other. The insulation layers may include a first insulation layer 30, a second insulation layer 40, and a third insulation layer 50, which are disposed on layers different from each other. The first sensing electrode TE1, the second sensing electrode TE2, the first signal line SL1, the second signal line SL2, and the pads PD in FIG. 3 are formed by the conductive patterns. The first insulation layer 30, the second insulation layer 40, and the third insulation layer 50 are omitted in FIG. 3 for convenience of description.

The first conductive layer 10 is disposed on the display unit DU. The first conductive layer 10 includes a plurality of first conductive patterns 11 and 12. Each of the first conductive patterns 11 and 12 may form one of the first sensing electrode TE1, the second sensing electrode TE2, the first signal line SL1, the second signal line SL2, and the pads PD.

The first conductive patterns 11 and 12 may include a first pattern 11 and a second pattern 12. The first pattern 11 and the second pattern 12 may be disposed on the same layer and have the same shape as each other. The first pattern 11 may include a top surface covered by the first insulation layer 30, and the second pattern 12 may include a top surface contacting the second conductive layer 20.

The second conductive layer 20 is disposed on the first conductive layer 10. The second conductive layer 20 includes a plurality of second conductive patterns 21 and 22. Each of the second conductive patterns 21 and 22 may form one of the first sensing electrode TE1, the second sensing electrode TE2, the first signal line SL1, the second signal line SL2, and the pads PD.

The second conductive patterns 21 and 22 may include a third pattern 21 and a fourth pattern 22. The third pattern 21 and the fourth pattern 22 may have shapes different from each other. The third pattern 21 may be disposed on the first insulation layer 30 and spaced apart from the first conductive layer 10. The fourth pattern 22 may pass through the first insulation layer 30 to contact the first conductive layer 10. The fourth pattern 22 may have a bottom surface contacting a top surface of the second pattern 12.

According to an exemplary embodiment, the second pattern 12 and the fourth pattern 22 may be omitted from the input sensing unit SU. In this case, the first conductive layer 10 may include the first patterns 11, and the second conductive layer 20 may include the third patterns 21.

Each of the first conductive patterns 11 and 12 and the second conductive patterns 21 and 22 may be disposed on an area overlapping the pixel defining layer PDL. Each of the first conductive layer 10 and the second conductive layer 20 may not overlap the light emitting areas PXA. Accordingly, the first conductive layer 10 and the second conductive layer 20 according to an exemplary embodiment of the invention may not affect the image IM displayed on the light emitting areas PXA, even when the first and second conductive layers 10 and 20 include an opaque material or have a large surface area. However, the inventive concepts are not limited thereto, and each of the first conductive layer 10 and the second conductive layer 20 may overlap at least a portion of the light emitting areas PXA.

The first insulation layer 30 is disposed between the first conductive layer 10 and the second conductive layer 20. The first insulation layer 30 separates the first conductive layer 10 and the second conductive layer 20 from each other, a portion of the first conductive layer 10 and the second conductive layer 20 may be electrically connected to the contact hole CH passing through the first insulation layer 30. Accordingly, the first pattern 11 and the third pattern 21 may be spaced apart from each other with the first insulation layer 30 therebetween, and the second pattern 12 and the fourth pattern 22 may be electrically connected through the contact hole CH.

The first insulation layer 30 may have an insulation property and be optically transparent. In addition, the first insulation layer 30 may include an organic material. Accordingly, the input sensing unit SU may be flexible. Hereinafter, the first insulation layer 30 will be described as an organic insulation layer.

The second insulation layer 40 is disposed on the organic insulation layer 30. The second insulation layer 40 covers a top surface of the organic insulation layer 30 and exposes a top surface of the second conductive layer 20.

The second insulation layer 40 may include an insulation material. According to the illustrated embodiment, the second insulation layer 40 may include an inorganic material.

The second insulation layer 40 protects the top surface of the organic insulation layer 30, which is exposed by the second conductive layer 20. The second insulation layer 40 has a thickness less than that of the first insulation layer 30. The second insulation layer 40 may have a thickness that does not affect the folding characteristics, i.e., the ability of the input sensing unit SU to be folded. Hereinafter, the second insulation layer 40 will be described as an inorganic insulation layer.

The third insulation layer 50 is disposed on the inorganic insulation layer 40. The third insulation layer 50 covers the second conductive layer 20. The top surface of the second conductive layer 20 may be exposed by the inorganic insulation layer 40 and contacts the third insulation layer 50.

The third insulation layer 50 may not overlap the second conductive layer 20 disposed on the pad area PA. The second conductive layer 20 in the pad area PA forms the pad PD, and at least a portion of a top surface thereof may be exposed by the third insulation layer 50. Accordingly, an opening 50-OP exposing at least a portion of the second conductive layer 20 may be defined in the third insulation layer 50.

The pad PD (e.g., the second conductive layer 20 in the pad area PA) exposed through the third insulation layer 50 may be connected to the circuit board CB. The connecting member AM is provided in the opening 50-OP to electrically connect the second conductive layer 20 forming the pad PD to the circuit board CB. Accordingly, a top surface of the pattern exposed from the third insulation layer 50 may contact the connecting member AM.

The third insulation layer 50 may include an insulation material. The third insulation layer 50 may include at least one of an inorganic material and/or an organic material. When the third insulation layer 50 includes an organic material, the input sensing unit SU may have improved flexibility. When the third insulation layer 50 includes an inorganic material, a thin-type input sensing unit SU may be provided, and the input sensing unit SU may have improved impact resistance strength. Although the third insulation layer 50 (hereinafter, referred to as a "protective layer") may include various materials, the inventive concepts are not limited thereto.

Referring to FIG. 4B, an electronic panel EP-M may include a first conductive layer 10-M and a second conductive layer 20-M, each of which includes a plurality of layers. The first conductive layer 10-M may include a first layer A1, a second layer A2, and a third layer A3, which are sequentially laminated in the third direction DR3.

The first layer A1, the second layer A2, and the third layer A3 may include the same material as each other or materials different from each other. Since the first conductive layer 10-M includes multiple layers, the first conductive layer 10-M may have improved process reliability, reduced internal resistance, and thus, have improved electric characteristics.

The second conductive layer 20-M may include a first layer B1, a second layer B2, and a third layer B3, which are sequentially laminated in the third direction DR3. The first layer B1, the second layer B2, and the third layer B3 may include the same material as each other or materials different from each other, and include the same material as or a different material from those of the first layer A1, the second layer A2, and the third layer A3 of the first conductive layer 10-M.

The electronic panels EP and EP-M according to exemplary embodiments of the invention may include the inorganic insulation layer 40 covering the top surface of the organic insulation layer 30, and exposing the top surface of the second conductive layer 20. In this manner, the flexibility of the organic insulation layer 30 may not be hindered and the top surface of the organic insulation layer 30 may be protected, which may enhance process reliability of the electronic panel EP and EP-M. This will be described in detail later.

Figure 5:
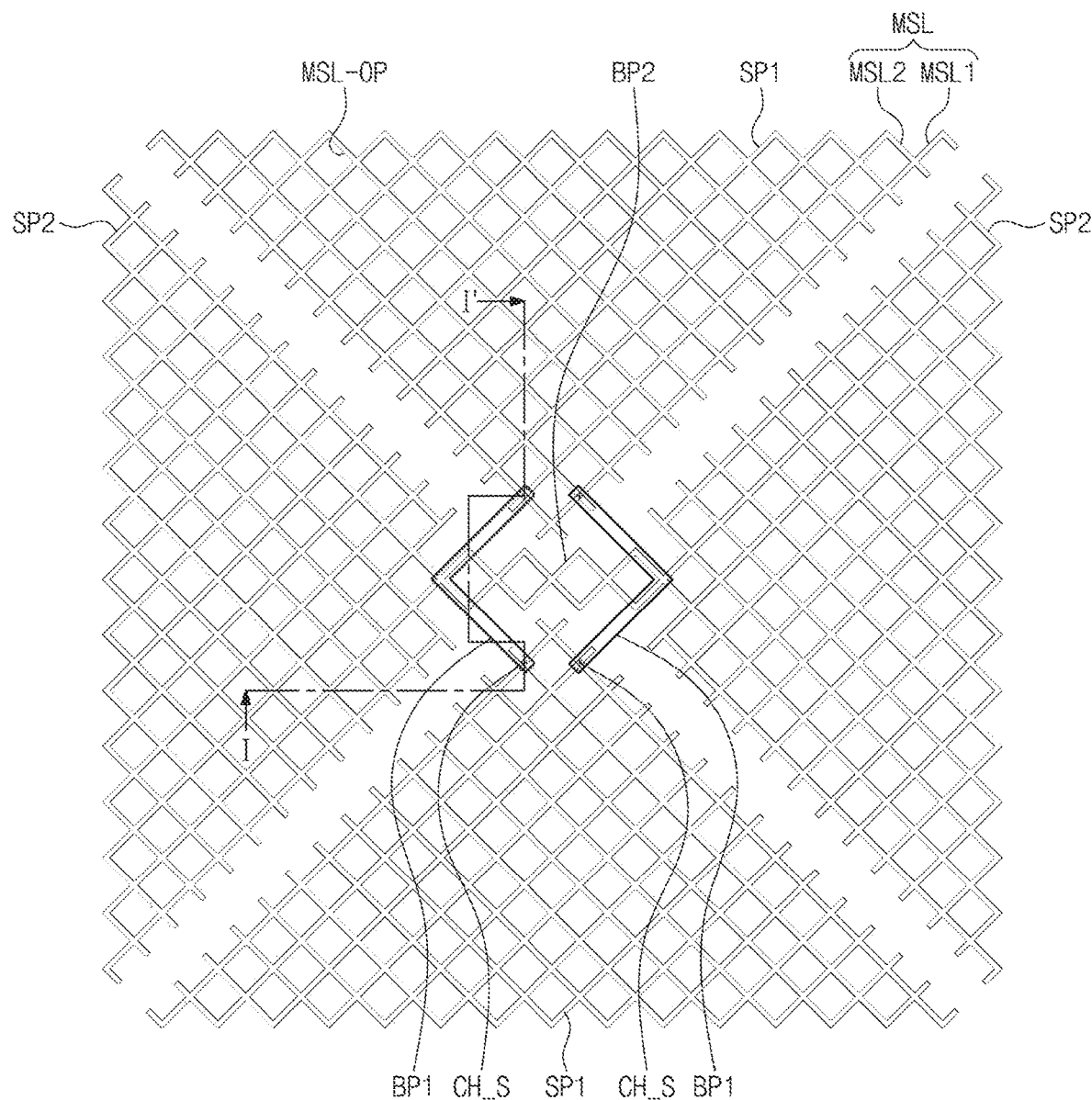
FIG. 5 is enlarged plan view of a partial area of FIG. 3.
Figure 5:
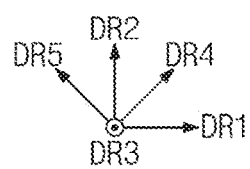

FIG. 5 is an enlarged plan view of a partial area along line I-I' of FIG. 3. In FIG. 5, only conductive patterns forming the input sensing unit SU are illustrated, and the insulation layers 30, 40, and 50 (refer to FIG. 4A) are omitted for convenience of description.

As illustrated in FIG. 5, the conductive patterns may include a plurality of mesh lines MSL. The mesh lines MSL include a first mesh line MSL1 extending in the fourth direction DR4 and a second mesh line MSL2 extending in the fifth direction DR5 and crossing the first mesh line MSL1. The first mesh line MSL1 and the second mesh line MSL2 may form a predetermined mesh opening MSL-OP.

Each of the first conductive patterns 11 and 12 and the second conductive patterns 21 and 22 described above may be a portion of each of the mesh lines. For example, the top surface of the first conductive layer 10 or the top surface of the second conductive layer 20 may correspond to the top surface of the mesh lines MSL, and the inorganic insulation layer 40 may be filled into the mesh opening MSL-OP.

The plurality of first sensor patterns SP1 are spaced apart from each other in the second direction DR2, and the plurality of second sensor patterns SP2 are spaced apart from each other in the first direction DR1. The second connecting pattern BP2 may extend in the first direction DR1 to connect the second sensor patterns SP2 to each other. According to the illustrated embodiment, the second sensor patterns SP2 and the second connecting pattern BP2 may each include the mesh lines MSL and may be integrated with each other.

The first sensor patterns SP1 may be connected by the first connecting pattern BP1 extending in the second direction DR2. The first connecting pattern BP1 and the second connecting pattern BP2 are disposed on layers different from each other. According to the illustrated embodiment, the first connecting pattern BP1 may be disposed on a layer different from that of the first sensor patterns SP1, the second sensor patterns SP2, and the second connecting pattern BP2. Accordingly, the first connecting pattern BP1 may pass through the organic insulation layer 30 (refer to FIG. 4A) and be connected to the first sensor patterns SP1.

The first connecting pattern BP1 may include the mesh lines MSL or a transparent pattern. Also, the first connecting pattern BP1 according to an exemplary embodiment may be disposed on the same layer as those of the first sensor patterns SP1. Here, the first sensor patterns SP1 and the second sensor patterns SP2 may be disposed on layers different from each other, and the first connecting pattern BP1 and the first sensor patterns SP1 may be integrated with each other.

Each of the first sensor patterns SP1, the second sensor patterns SP2, the first connecting pattern BP1, and the second connecting pattern BP2 according to an exemplary embodiment may include the first conductive layer 10 (refer to FIG. 4A) and the second conductive layer 20 (refer to FIG. 4A), and may be formed in various combinations. The inorganic insulation layer 40 may have a shape exposing the mesh lines MSL forming the second conductive layer 20 and covering the mesh lines MSL. This will be described in detail later.

Figure 6A:
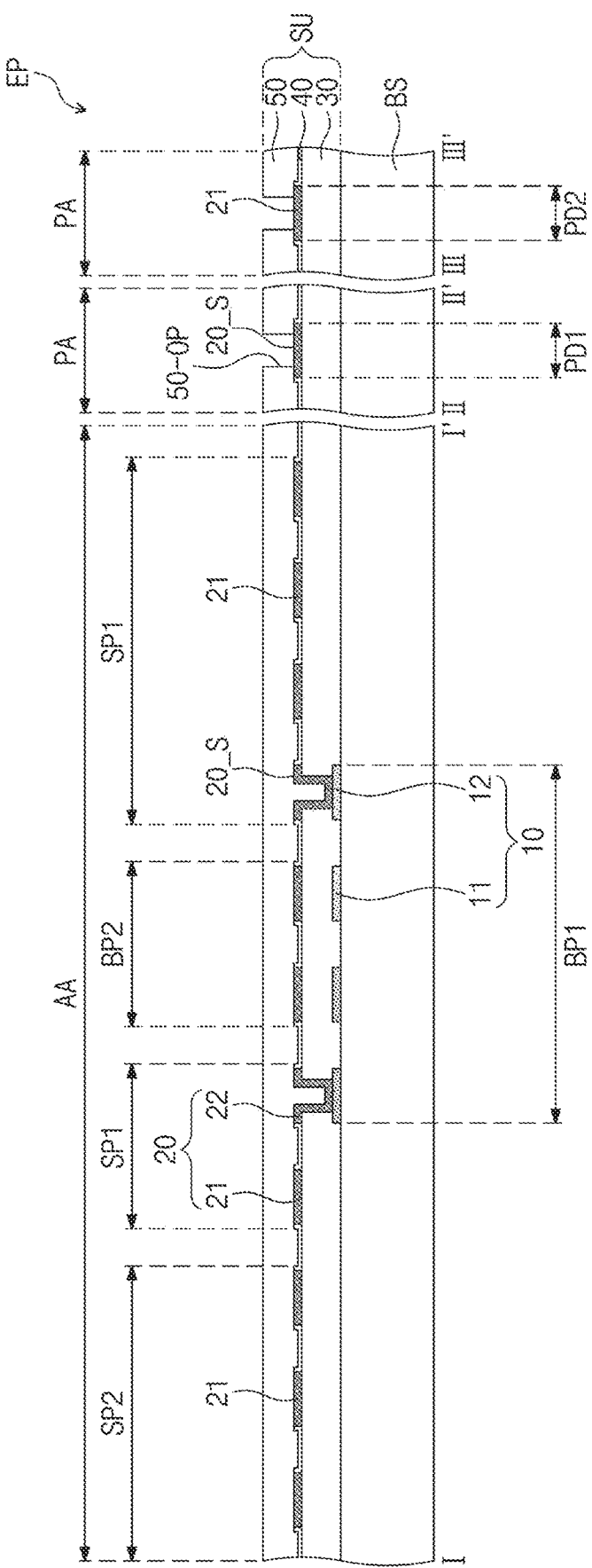
FIG. 6A, FIG. 6B, and FIG. 6C are cross-sectional views illustrating portions of respective electronic panels according to exemplary embodiments of the invention.
Figure 6B:
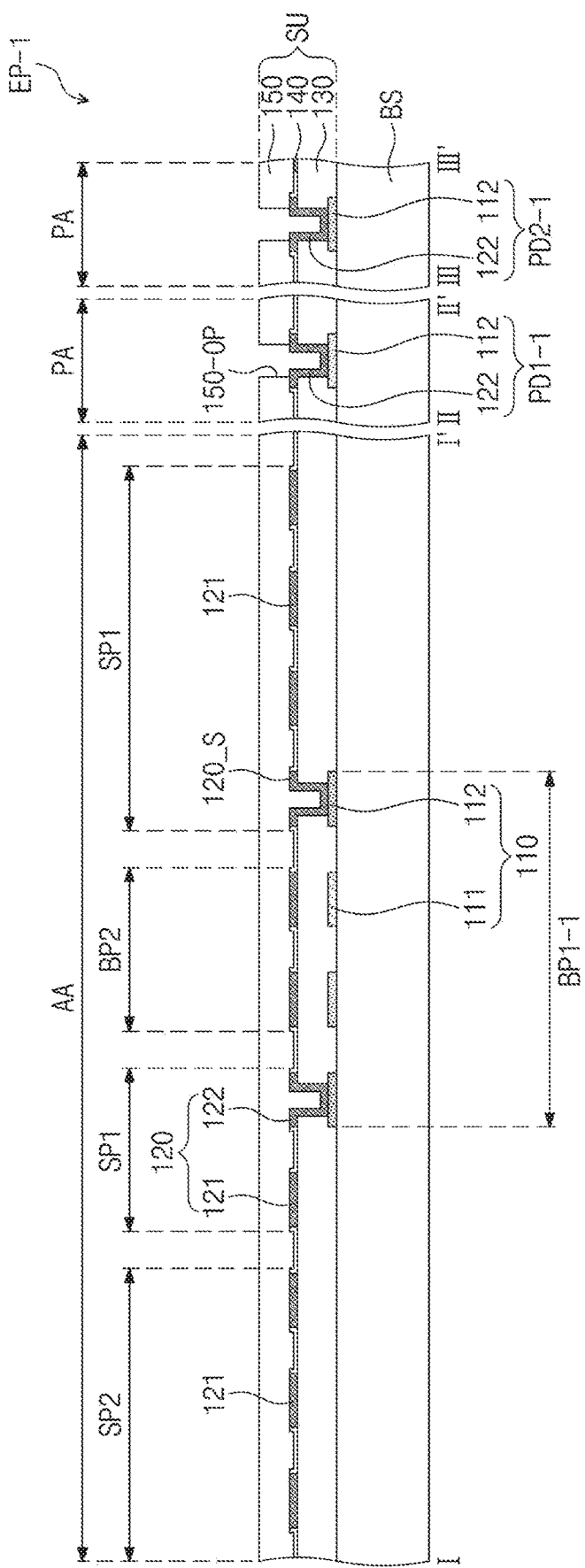
Figure 6C:
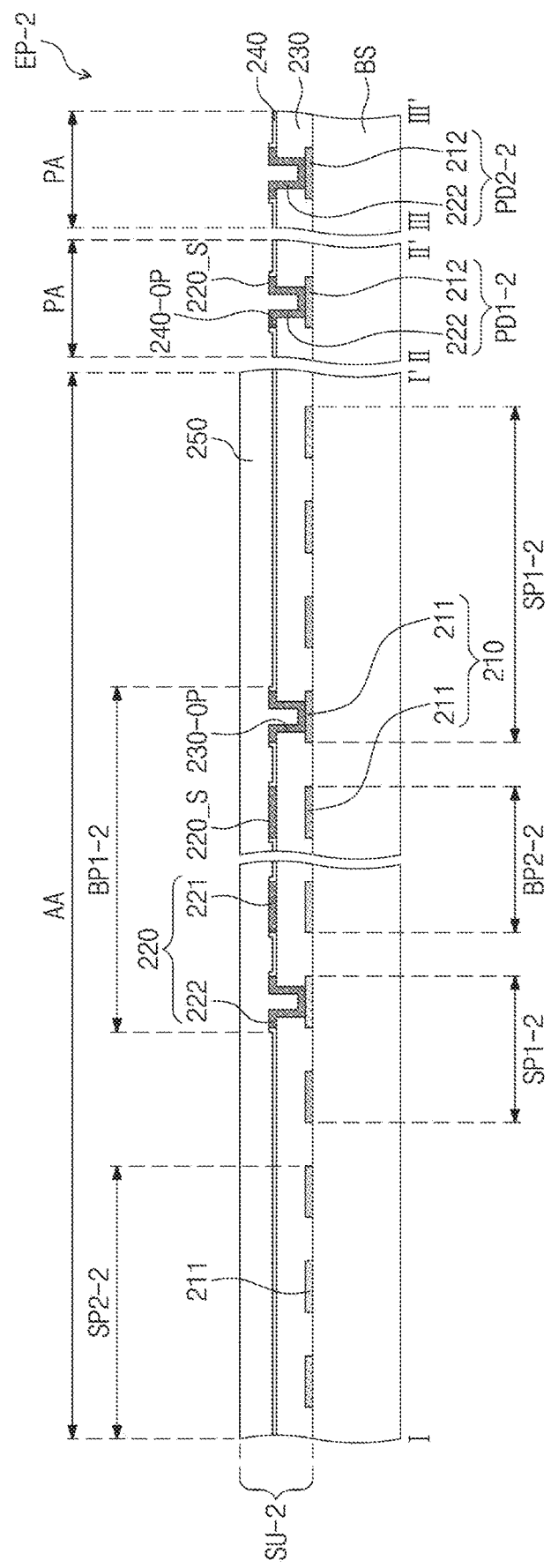

FIGS. 6A to 6C are cross-sectional views illustrating portions of respective electronic panels according to exemplary embodiments of the invention. FIG. 6A illustrates cross sectional areas taken along lines I-I', and of FIG. 3, and FIGS. 6B and 6C illustrate cross sectional areas corresponding to those in FIG. 6A according to other exemplary embodiments of the invention.

The line I-I' of FIG. 3 may correspond to the line I-I' of FIG. 5. Accordingly, each of the first conductive patterns and the second conductive patterns may correspond to a portion of each of the mesh lines MSL.

Hereinafter, electronic panels EP, EP-1, and EP-2 according exemplary embodiments of the invention will be described with reference to FIGS. 6A and 6C, respectively. In FIGS. 6A to 6C, the same elements as those described in FIGS. 1A to 5 are designated by the same reference symbols, and thus, redundant descriptions thereof will be omitted.

According to an exemplary embodiment, the electronic panel EP may include the base substrate BS and the input sensing unit SU. The base substrate BS may correspond to the above-described display unit DU. For example, the base substrate BS may be an insulation substrate. Here, the active area AA of the electronic panel EP may detect only the external input (refer to FIG. 1A) and may not display the image IM (refer to FIG. 1A).

As illustrated in FIG. 6A, the electronic panel EP may include the first connecting pattern BP1 disposed below the second connecting pattern BP2. Accordingly, the first conductive layer 10 may include the first connecting pattern BP1.

The first conductive patterns 11 and 12 form the first connecting pattern BP1. Accordingly, the first conductive patterns 11 and 12 of FIG. 6A may be connected to each other.

The first sensor patterns SP1, the second sensor pattern SP2, and the second connecting pattern BP2 may be disposed on the same layer as each other. The first sensor patterns SP1, the second sensor pattern SP2, and the second connecting pattern BP2 are disposed on the first connecting pattern BP1. Accordingly, the second conductive layer 20 may include the first sensor patterns SP1, the second sensor patterns SP2, and the second connecting pattern BP2.

The second conductive patterns 21 and 22 may form the first sensor patterns SP1, the second sensor patterns SP2, and the second connecting pattern BP2. According to the illustrated embodiment, the second sensor pattern SP2 and the second connecting pattern BP2 may be formed by the third pattern 21 of the second conductive patterns 21 and 22, and the first sensor patterns SP1 may be formed by the third pattern 21 and the fourth pattern 22.

As described above, the third pattern 21 of the second conductive patterns 21 and 22 may be spaced apart from the first conductive layer 10. The third pattern 21 is disposed on a top surface of the organic insulation layer 30, and is not directly connected to the first conductive layer 10.

The fourth pattern 22 of the second conductive patterns 21 and 22 may pass through the organic insulation layer 30. The fourth pattern 22 of the first conductive patterns 11 and 22 is connected to the second pattern 12. The fourth pattern 22 is directly connected to the first conductive layer 10.

The second conductive layer 20 according to the illustrated embodiment may further include a first pad PD1 and a second pad PD2. Each of the first pad PD1 and the second pad PD2 may be formed by the second conductive patterns 21 and 22. For example, each of the first pad PD1 and the second pad PD2 includes the third pattern 21.

The organic insulation layer 30 is disposed between the first conductive layer 10 and the second conductive layer 20. The organic insulation layer 30 may overlap the active area AA and the pad area PA on a plane. The organic insulation layer 30 may extend from the active area AA to the pad area PA. Accordingly, the conductive pattern 21 disposed on the pad area PA, among the second conductive patterns 21 and 22, may be disposed on the organic insulation layer 30.

The inorganic insulation layer 40 is disposed on the organic insulation layer 30 to cover a top surface of the organic insulation layer 30. The inorganic insulation layer 40 may cover the top surface of the organic insulation layer 30, on which the second conductive patterns 21 and 22 are not disposed.

The inorganic insulation layer 40 exposes the top surface 20_S of the second conductive layer 20. The inorganic insulation layer 40 may not overlap the first pattern 21 and the second pattern 22 in plan view.

The inorganic insulation layer 40 may overlap the active area AA and the pad area PA on the plane. The inorganic insulation layer 40 may extend from the active area AA to the pad area PA. Accordingly, a portion of the top surface of the organic insulation layer 30, which overlaps the pad area PA, may be covered by the inorganic insulation layer 40. According to the illustrated embodiment, the inorganic insulation layer 40 may not overlap the second pattern 22 forming the first pad PD1 and the second pattern 22 forming the second pad PD2 in plan view.

The protective layer 50 is disposed on the inorganic insulation layer 40. The protective layer 50 may cover the inorganic insulation layer 40 and the second conductive layer 20. As the electronic panel EP further includes the inorganic insulation layer 40, the top surface 20_S of the second conductive layer may contact the protective layer 50.

The protective layer 50 may overlap the active area AA and may not substantially overlap the pad area PA. Accordingly, the top surface of the second conductive layer forming the pads PD1 and PD2 of the second conductive patterns 21 and 22 is exposed by the protective layer 50.

Referring to FIG. 6B, the electronic panel EP-1 may include pads PD1-1 and PD2-1 each including a plurality of conductive patterns. The input sensing unit SU-1 includes a first conductive layer 110, a second conductive layer 120, an organic insulation layer 130, and an inorganic insulation layer 140. The first conductive layer 110 may include first conductive patterns 111 and 112 forming a first connecting pattern BP1-1 and a first conductive pattern 112 disposed on the pad area PA.

The organic insulation layer 130 may further include a contact hole defined in the pad area PA. A fourth pattern 122 of the second conductive patterns 121 and 122 is disposed on the pad area PA. Accordingly, the pads PD1-1 and PD2-1 may include the second pattern 112 of the first conductive patterns 111 and 112 and the fourth pattern 122 of the second conductive patterns 121 and 122.

The inorganic insulation layer 140 is disposed on the active area AA and the pad area PA to cover the organic insulation layer 130, and exposes a top surface of the second conductive layer 120. The inorganic insulation layer 140 may be substantially the same as the inorganic insulation layer 40 of FIG. 6A.

As the electronic panel EP-1 according to an exemplary embodiment includes the pads PD1-1 and PD2-1, each including a plurality of conductive patterns, the internal resistance of the pads PD1-1 and PD2-1 may be reduced, and the pads PD1-1 PD2-1 may be prevented from being delaminated from the organic insulation layer 130.

Referring to FIG. 6C, the electronic panel EP-2 may include an input sensing unit SU-2 including a first conductive layer 210, a second conductive layer 220, an organic insulation layer 230, an inorganic insulation layer 240, and a protective layer 250. The input sensing unit SU-2 according to an exemplary embodiment may include a first connecting pattern BP1-2 disposed on a second connecting pattern BP2-2.

The input sensing unit SU-2 may include the same components as those of the input sensing unit SU in FIG. 5. Accordingly, the first conductive layer 210 may include a first sensor patterns SP1-2, a second sensor patterns SP2-2, and the second connecting pattern BP2-2. The first conductive patterns 211 and 212 may form the first sensor patterns SP1-2, the second sensor patterns SP2-2, and the second connecting pattern BP2-2.

However, in FIG. 6C, the protective layer 250 may entirely expose the pad area PA. In particular, the protective layer 250 may overlap only the active area, and may not overlap the pad area PA. Accordingly, each of the first pad PD1-2 and the second pad PD2-2, as well as the inorganic insulation layer 240 exposing the first pad PD1-2 and the second pad PD2-2, may be exposed by elimination of the protective layer 250 in the pad area PA, as shown in FIG. 6C.

The second conductive layer 220 may include the first connecting pattern BP1-2. The second conductive patterns 221 and 222 form the first connecting pattern BP1-2. The second conductive patterns 221 and 222 may be connected to each other.

The inorganic insulation layer 240 is disposed on the organic insulation layer 230 to cover a top surface of the organic insulation layer 230 that does not overlap the first connecting pattern BP1-2, and exposes the top surface 220_S of the first connecting pattern BP1-2, each of the first pad PD1-2 and the second pad PD2-2 may include a second pattern 212 and a fourth pattern 222. The inorganic insulation layer 240 exposes top surfaces of the pads PD1-2 and PD2-2.

Although the first sensor patterns SP1-2 and the second sensor pattern SP2-2 are disposed below the organic insulation layer 230 in the electronic panel EP-2, each of the pads PD1-2 and PD2-2 may include a plurality of conductive patterns, and a contact surface of each of the pads PD1-2 and PD2-2 may be provided above the organic insulation layer 230. Accordingly, although the first sensor patterns SP1-2 and the second sensor pattern SP2-1 are covered by the organic insulation layer 230, the first sensor patterns SP1-2 and the second sensor pattern SP2-2 may stably provide an electric signal.

According to an exemplary embodiment, the pads PD1-2 and PD2-2 may have structures different from each other. For example, the first pad PD1-2 may be formed by the third pattern 21, and the second pad PD2-2 may be formed by the second pattern 12 and the fourth pattern 22.

Figure 7A:
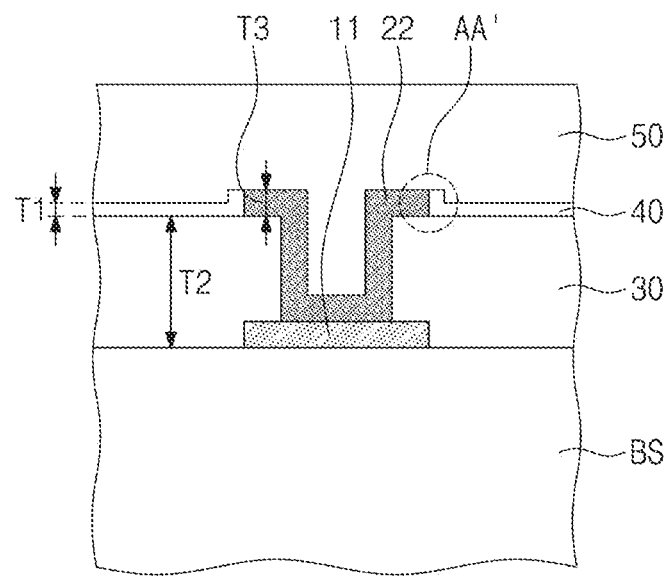
FIG. 7A, FIG. 7B, and FIG. 7C are cross-sectional views illustrating a portion of respective exemplary embodiments of an input sensing unit constructed according to the principles of the invention.
Figure 7B:
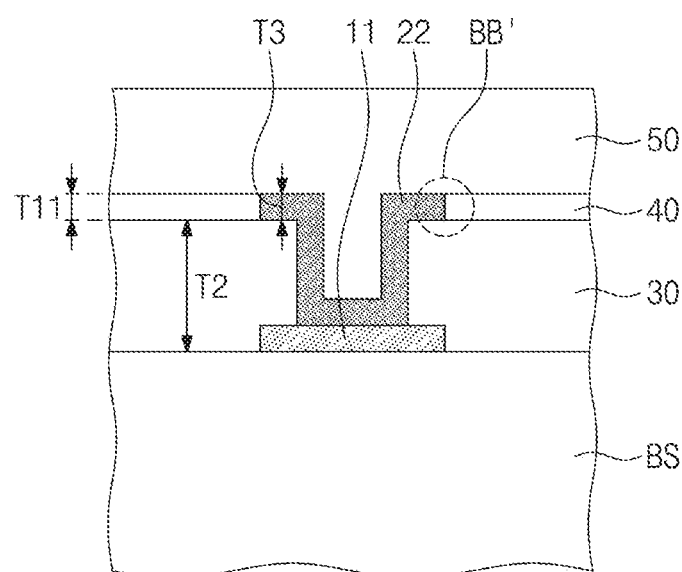
Figure 7C:
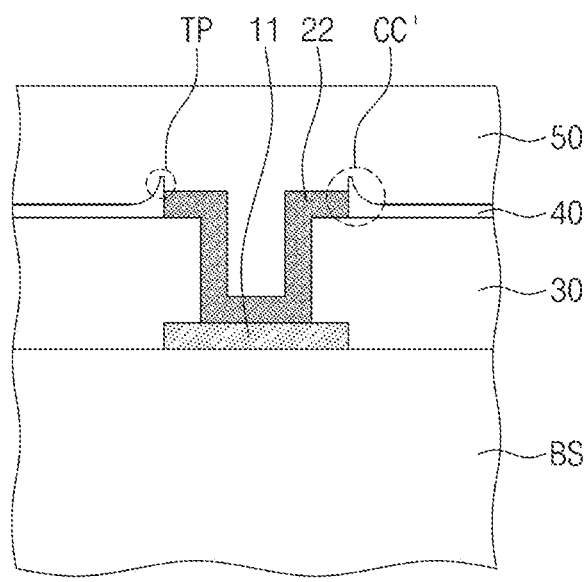

FIGS. 7A to 7C are cross-sectional views illustrating a portion of respective exemplary embodiments of an input sensing unit constructed according to the principles of the invention. FIGS. 7A to 7C respectively illustrate a portion including the second pattern 12 of the first conductive patterns and the fourth pattern 22 of the second conductive patterns.

As illustrated in FIG. 7A, the inorganic insulation layer 40 may have a thickness T1 less than a thickness T2 of the organic insulation layer 30. The inorganic insulation layer 40 may have the thickness T1 that is wide enough to cover the top surface of the organic insulation layer 30. According to an exemplary embodiment, as the inorganic insulation layer 40 having a relatively rigid characteristic has a thickness substantially less than the thickness T2 of the organic insulation layer 30, the inorganic insulation layer 40 may not substantially hinder the folding characteristics of the organic insulation layer 30.

The thickness T1 of the inorganic insulation layer 40 may be less than a thickness T3 of the fourth pattern 22. Accordingly, as shown in FIG. 7A, a portion AA' of the inorganic insulation layer 40 may be stepped at an edge of the fourth pattern 22.

Referring to FIG. 7B, the inorganic insulation layer 40 according to an exemplary embodiment may have a thickness T11 that is substantially the same as the thickness T2 of the fourth pattern 22. Accordingly, as shown in FIG. 7B, a top surface BB' of the inorganic insulation layer 40 may be flush (without being stepped) with the top surface of the fourth pattern 22.

Referring to FIG. 7C, the inorganic insulation layer 40 may further include a tip portion TP protruding from an edge of the fourth pattern 22. The tip portion TP may be a portion of the inorganic insulation layer 40 that extends along a side surface of the fourth pattern 22 to protrude upwardly above a top surface of the fourth pattern 22. The tip portion TP may be formed in a lift-off process of forming the inorganic insulation layer 40, which will be described in detail later.

The electronic panel according to exemplary embodiments of the invention may include the inorganic insulation layer 40 having various shapes. The inorganic insulation layer 40 may have a shape capable of covering the top surface of the organic insulation layer 30 and exposing the top surface of the second conductive layer, while having a thickness that is large enough to prevent external pollutants from being introduced to the top surface of the organic insulation layer 30. Accordingly, the organic insulation layer 40 may have a thickness equal to or less than that of the second conductive layer or equal to or less than about 500 Å. In this manner, light generated from the display unit DU (refer to FIG. 3B) may pass through the input sensing unit SU (refer to FIG. 3B) and be easily seen to an external user, while minimizing impact to optical and physical characteristics of the inorganic insulation layer 30.

FIGS. 8A to 8J are cross-sectional views illustrating an exemplary method of manufacturing an electronic panel according to the principles of the invention. The electronic panel EP of FIGS. 8A to 8J will be described as having the structure of the electronic panel EP of FIG. 6A for convenience of description.

As illustrated in FIG. 8A, the first conductive layer 10 is formed on the base substrate BS. The base substrate BS may correspond to the above-described display unit DU (see FIG. 4A) or an insulation substrate. The first conductive layer 10 includes a plurality of first conductive patterns 11 and 12.

The first conductive patterns 11 and 12 may be formed by applying a conductive material on the top surface of the base substrate BS and patterning the applied conductive material layer. The first conductive patterns 11 and 12 may be the first connecting pattern BP1 (see FIG. 3) disposed on the active area AA.

Thereafter, as illustrated in FIG. 8B, a first initial layer 30I is formed on the first conductive layer 10. The first initial layer 30I may include an organic material. The first initial layer 30I may be formed by applying an organic material in a liquid state to the base substrate BS and the top surface of the first conductive layer 10.

Thereafter, as illustrated in FIG. 8C, the contact hole 30-OP is defined in the first initial layer 30I to form the organic insulation layer 30. The contact hole 30-OP may be formed by removing the first initial layer 30I overlapping a portion of the first conductive layer 10 to expose a portion of the first conductive layer 10.

Thereafter, as illustrated in FIG. 8D, a second initial layer 201 is formed on the organic insulation layer 30. The second initial layer 201 covers the top surface of the organic insulation layer 30. The second initial layer 201 may be formed while filling the contact hole CH. In this case, the second initial layer 201 contacts a top surface of a partial pattern of the first conductive layer 10, which is exposed through the contact hole 30-OP.

The second initial layer 201 may include a conductive material. The second initial layer 201 may have a lamination structure in which a plurality of conductive material layers are sequentially laminated. The second initial layer 201 may be formed through a deposition process.

Thereafter, as illustrated in FIGS. 8E and 8F, the second initial layer 201 is patterned to form the second conductive layer 20. More particularly, a plurality of photoresist patterns PR are arranged on the second initial layer 201, and light (PT) is irradiated. Thereafter, when portions to which the light is irradiated are removed through a development process, a plurality of second conductive patterns 21 and 22 may be formed. According to the illustrated embodiment, the photoresist patterns PR may include a positive photo-sensitive material.

As illustrated in FIG. 8F, in the process of forming the second conductive layer 20, the top surface 30_S of a portion of the organic insulation layer 30, which does not overlap the second conductive patterns 21 and 22, may be exposed. In this case, the top surface 30_S of the organic insulation layer 30 may be damaged by chemical materials used during the process of removing the photoresist patterns PR.

Figure 8G:
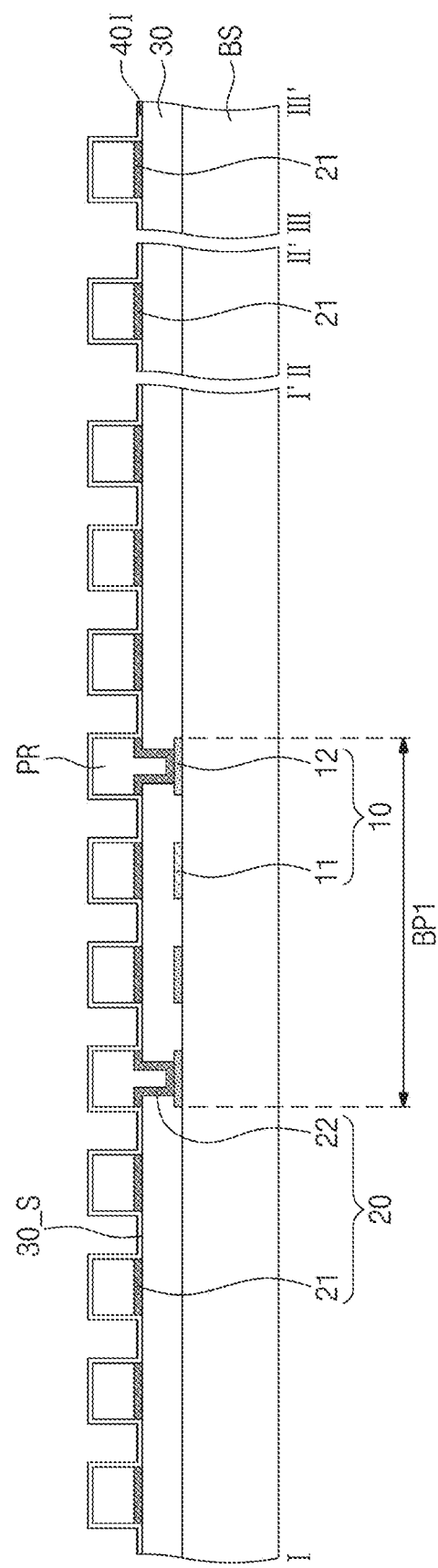

According to an exemplary embodiment of the invention, as illustrated in FIG. 8G, a third initial layer 40I covering a top surface 30_S of the organic insulation layer 30 may be formed. The third initial layer 40I covers the top surface 30_S of the organic insulation layer 30 and the photoresist patterns PR. In this case, a portion of a side surface of the photoresist patterns PR may also be covered by the third initial layer 40I.

The third initial layer 40I may include an inorganic material. The third initial layer 40I may be formed through a deposition process. The third initial layer 40I may cover all or substantially all of the entire top surface of the organic insulation layer 30. The third initial layer 40I may have a thickness less than that of the first initial layer 30I. The first initial layer 30I may have a thickness equal to or less than that of the second conductive patterns 21 and 22.

Figure 8H:
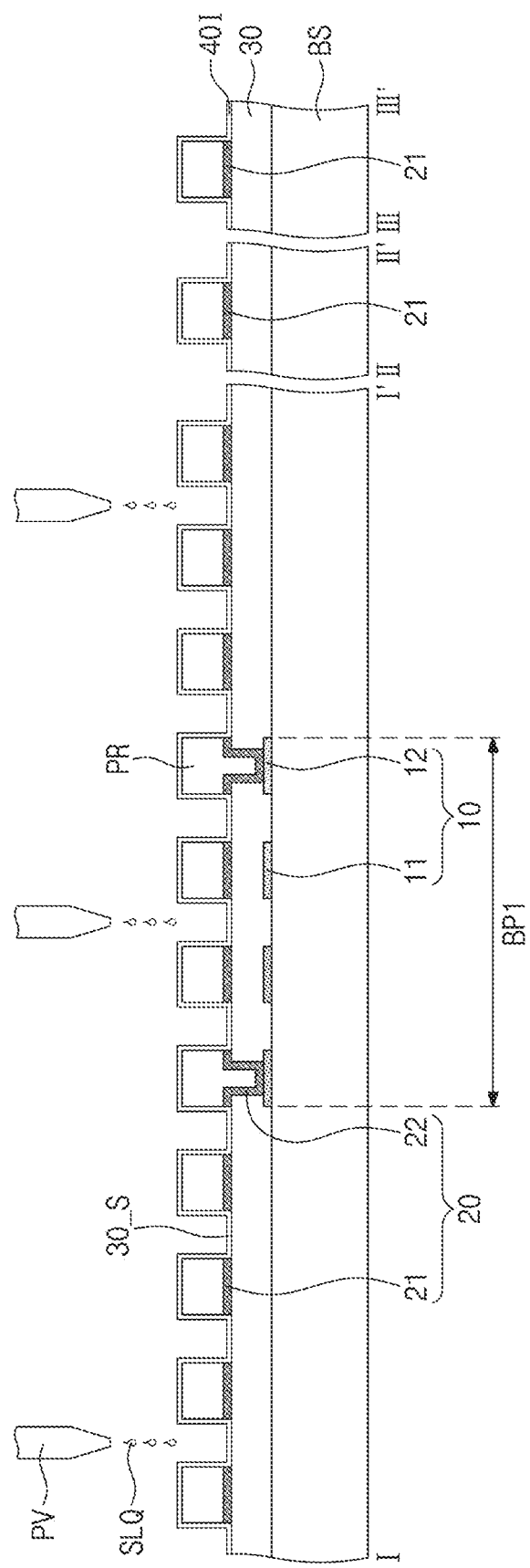
Figure 8I:
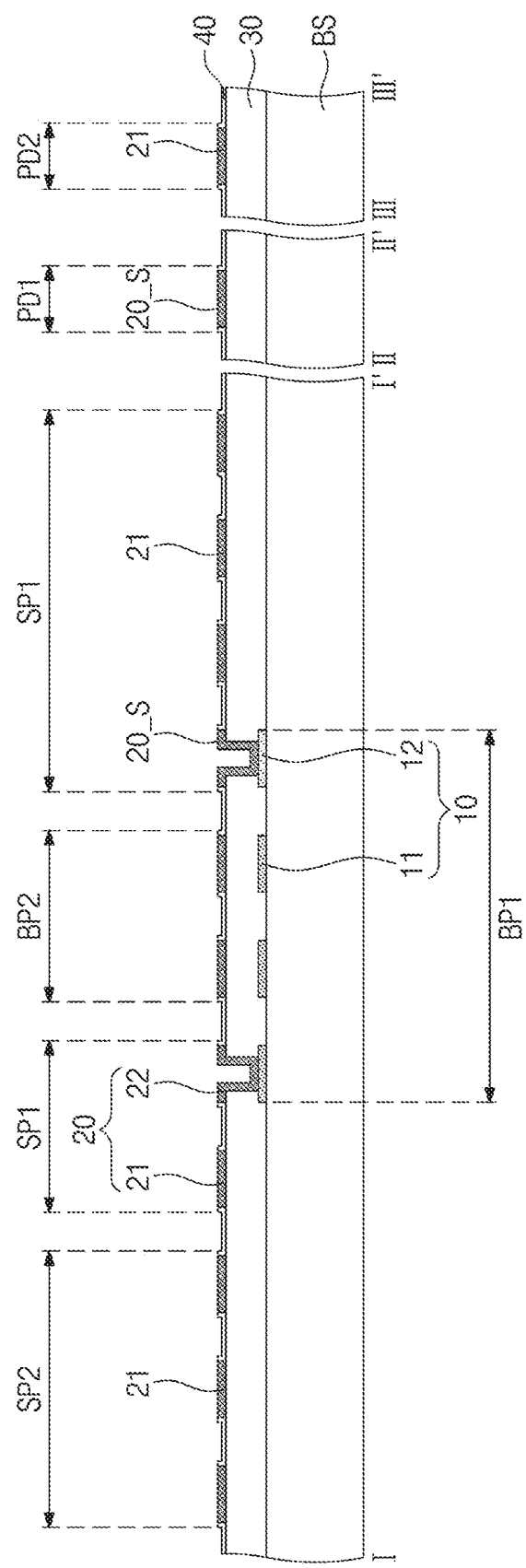

Thereafter, as illustrated in FIGS. 8H and 8I, the photoresist patterns PR are removed to form the inorganic insulation layer 40. For example, a strip solution SLQ may be used to remove the photoresist patterns PR. The strip solution SLQ provided from a dispensing part PV melts the photoresist patterns PR, so that the photoresist patterns PR is easily removed from the second conductive layer 20. In this case, a side surface of the photoresist patterns PR may be relatively lightly coated with the third initial layer 40I as compared to a top surface of the organic insulation layer 30, or some portions thereof may not be coated with the third initial layer 40I. Accordingly, the strip solution SLQ may be easily introduced into the photoresist patterns PR.

The top surface 30_S of the organic insulation layer 30 may be coated with the third initial layer 40I in a relatively greater thickness as compared with the side surface of the photoresist patterns PR. Accordingly, the strip solution SLQ may not be easily introduced into the organic insulation layer 30, and the organic insulation layer 30 may be stably protected from the strip solution SLQ.

An ashing process may be further added before the strip solution SLQ is provided. The ashing process may utilize an ashing gas or the like. The ashing gas may partially remove the third initial layer 40I coated on the side surface of the photoresist patterns PR or accelerate the melting of the photoresist patterns PR.

When the photoresist patterns PR melted by the strip solution SLQ is removed, the second conductive patterns 21 and 22 are exposed. Portions of the third initial layer 40I covering the photoresist patterns PR may be removed at the same time when the photoresist patterns PR are removed. More particularly, a portion of the third initial layer 40I is removed when the photoresist patterns PR is lifted-off, such that the inorganic insulation layer 40 exposing the second conductive patterns 21 and 22 is formed.

In this case, the tip portion TP (refer to FIG. 8C), of which a portion of the inorganic insulation layer 40 protrudes upward due to viscosity of the inorganic insulation layer 40 or the like, may be formed. The tip portion TP may be a partial shape of the inorganic insulation layer 40, which is generated by the lift-off process.

Figure 8J:
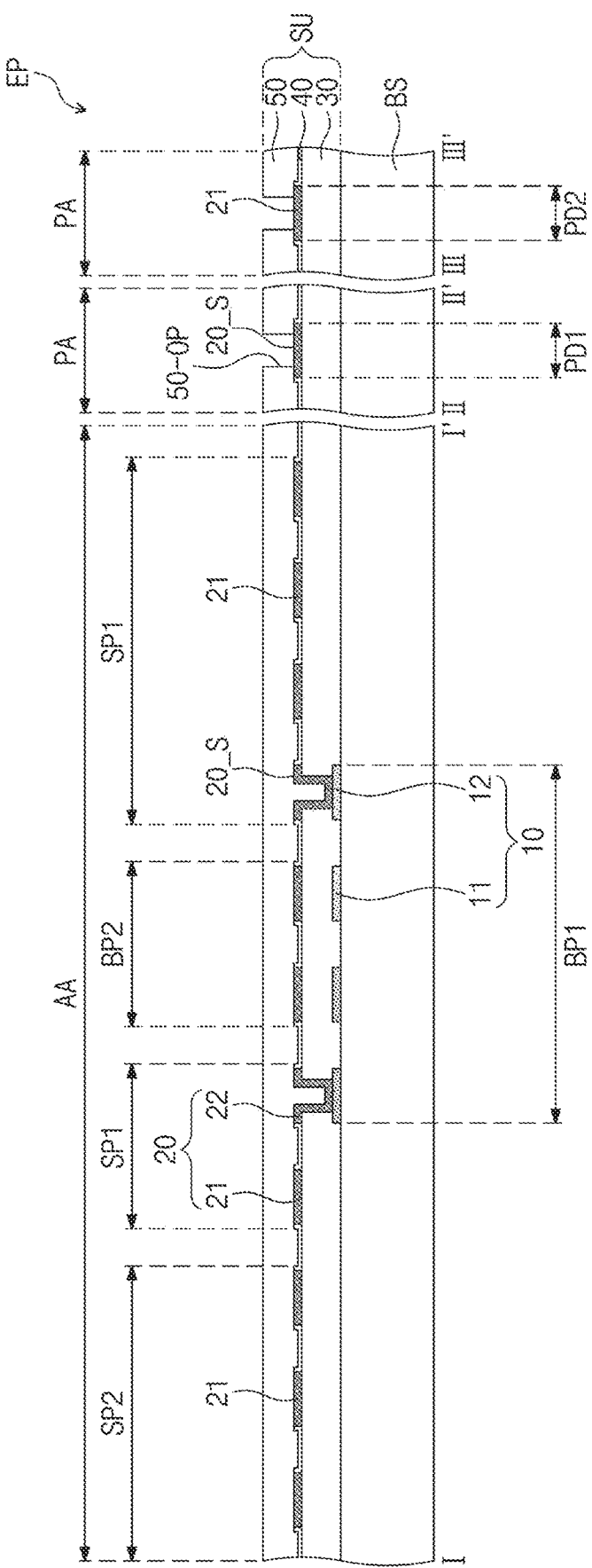

Thereafter, as illustrated in FIG. 8J, the protective layer 50 is formed to form the electronic panel EP. The protective layer 50 may overlap the active area AA. The protective layer 50 covers a top surface of the inorganic insulation layer 40 and a top surface 20_S of the second conductive layer 20. The protective layer 50 may be formed by at least one organic layer and/or one inorganic layer. The protective layer 50 may be formed through a deposition or coating process.

The protective layer 50 is disposed on the pad area PA of the second conductive layer 20, and does not cover the top surface of the second conductive pattern 22 defining the pads PD1 and PD2. As described above, the top surface of the second conductive pattern 22 defining the pads PD1 and PD2 may be connected to the circuit board CB (refer to FIG. 1B).

According to an exemplary embodiment of the invention, as the inorganic insulation layer 40 is formed, the organic insulation layer 30 may be prevented from being damaged in the process of removing the photoresist patterns PR. Accordingly, the organic insulation layer 30 may have an improved chemical resistance, and the process of manufacturing the electronic panel EP may have improved reliability. Also, according to an exemplary embodiment of the invention, an additional ashing process for exposing the top surface of the pads PD1 and PD2 is not required. Since the pads PD1 and PD2 are exposed from the inorganic layer 40 during the removal process of the photoresist patterns PR, the pads PD1 and PD2 may be stably connected to an external terminal without an additional process of exposing the pads PD1 and PD2 from the inorganic layer 40.

Figure 9:
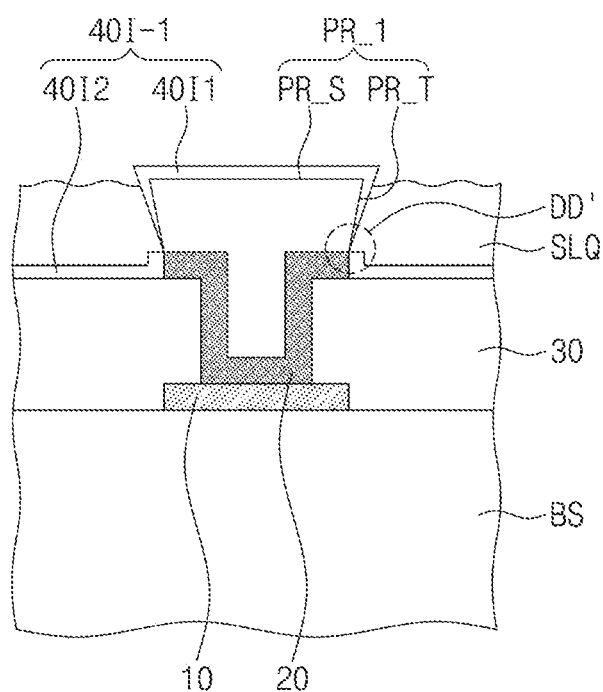
FIG. 9 is a cross-sectional view illustrating an exemplary embodiment of a photoresist pattern constructed according to the principles t of the invention.

FIG. 9 is a cross-sectional view illustrating an exemplary embodiment of a photoresist pattern constructed according to the principles of the invention. In FIG. 9 one photoresist pattern PR-1 and a process corresponding to that in FIG. 8H are shown. Hereinafter, the same elements as those described in FIGS. 1A to 8J are designated by the same reference symbols, and redundant descriptions thereof will be omitted.

As illustrated in FIG. 9, the photoresist pattern PR-1 may have a tapered side surface. In detail, the photoresist pattern PR-1 may have a shape that is gradually narrowed in a direction toward the second conductive pattern 22.

A third initial layer 40I-1 may include a first portion 4011 and a second portion 4012. The first portion 4011 covers a top surface and a portion of a side surface of the photoresist pattern PR-1. The second portion 4012 covers the top surface of the organic insulation layer 30.

According to the illustrated embodiment, the first portion 4011 and the second portion 4012 of the third initial layer 40I-1 may be physically separated. Accordingly, as illustrated in an area DD', a portion adjacent to an interface between the photoresist pattern PR-1 and the second conductive pattern 22 may not be partially covered by the fourth initial layer 40I-1. As such, the photoresist pattern PR-1 exposed from the third initial layer 40I-1 may easily react with the strip solution SLQ. Accordingly, the photoresist pattern PR-1 may be stably removed.

In the method of manufacturing the electronic panel according to an exemplary embodiment of the invention, as the shape of the photoresist pattern PR-1 is changed, the photoresist pattern PR-1 may be easily removed without deformation of the second conductive pattern or damage to the organic insulation layer 30. Accordingly, the process may be simplified, and the process reliability may be enhanced.

According to the exemplary embodiments of the invention, as the electronic panel further includes the protective layer protecting the organic insulation layer, the chemical resistance of the organic insulation layer may be improved. Accordingly, the organic insulation layer may be prevented from being damaged by the chemical solution provided in the manufacturing process.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
an electronic panel having an active area and a pad area, the electronic panel including a sensing unit responsive to external input; and
a circuit board connected to the electronic panel in the pad area,
wherein the sensing unit comprises:
a first conductive layer disposed on the active area;
a second conductive layer disposed on the first conductive layer, and having a first surface facing away from the first conductive layer and a second, opposing surface facing the first conductive layer;
an organic insulation layer disposed between the first conductive layer and the second conductive layer, and having a first surface facing the second conductive layer; and
an inorganic insulation layer covering the first surface of the organic insulation layer and exposing the first surface of the second conductive layer,
wherein the electronic panel further comprises a sensing electrode comprising a plurality of sensor patterns disposed in the active area and a plurality of connecting patterns disposed on a layer different from those of the sensor patterns with the organic insulation layer disposed therebetween,
wherein the first conductive layer comprises the sensor patterns, the second conductive layer comprises the connecting patterns, the sensor patterns pass through the organic insulation layer and are connected to the connecting patterns, and
wherein the sensor patterns are exposed through the inorganic insulation layer.

2. The electronic device of claim 1, wherein:
the first conductive layer comprises a plurality of first conductive patterns;
the second conductive layer comprises a plurality of second conductive patterns;
the second conductive patterns comprise:
a first pattern disposed on the organic insulation layer; and
a second pattern passing through the organic insulation layer and connected to
the first conductive layer;
the first pattern of the second conductive patterns is spaced apart from the first conductive patterns;
the second pattern of the second conductive patterns is connected to one of the first conductive patterns; and
the inorganic insulation layer exposes a first surface of the first pattern and a first surface of the second pattern.

3. The electronic device of claim 1, wherein the first surface of the organic insulation layer is a top surface thereof and the first surface of the second conductive layer is a top surface thereof.

4. The electronic device of claim 1, wherein:
the first and second conductive layers comprise mesh lines having openings exposing the organic insulation layer; and
the inorganic insulation layer exposes a first surface of the mesh lines and covers first surfaces of the organic insulation layer exposed by the openings.

5. The electronic device of claim 1, wherein the inorganic insulation layer has a thickness less than that of the organic insulation layer.

6. The electronic device of claim 1, wherein:
the inorganic insulation layer has a thickness equal to or less than that of the second conductive layer; and
the inorganic insulation layer has a thickness equal to or less than about 500 Å.

7. The electronic device of claim 1, wherein the organic insulation layer is directly disposed on a top surface of the first conductive layer.

8. The electronic device of claim 1, wherein:
the second conductive layer further comprises a pad pattern disposed on the pad area and connected to the sensing electrode; and
the pad pattern is exposed by the inorganic insulation layer.

9. The electronic device of claim 1, wherein:
the first conductive layer further comprises a lower pattern disposed on the pad area;
the second conductive layer further comprises an upper pattern disposed on the pad area, passing through the organic insulation layer, and connected to the lower pattern;
the sensing electrode is connected to at least one of the upper pattern and the lower pattern; and
the inorganic insulation layer exposes the upper pattern.

10. The electronic device of claim 1, wherein:
the electronic panel further comprises a protective layer disposed on the inorganic insulation layer covering the second conductive layer; and
the protective layer covers substantially the entire active area and exposes at least a portion of the pad area.

11. An electronic panel comprising:
a display unit configured to display an image; and
a sensing unit disposed on the display unit and configured to detect an external input,
wherein:
the sensing unit comprises:
- a plurality of first sensor patterns;
- a plurality of first connecting patterns connecting adjacent ones of the first sensor patterns to each other;
- a plurality of second sensor patterns insulated from the first sensor patterns;
- a plurality of second connecting patterns connecting adjacent ones of the second sensor patterns to each other;
- an organic insulation layer disposed between the first connecting patterns and the second connecting patterns, and having a top surface facing the second connecting patterns; and
- an inorganic insulation layer covering the top surface of the organic insulation layer, and exposing a surface of a conductive pattern disposed on the organic insulation layer that faces away from the top surface of the organic insulation layer, wherein the first connecting patterns are disposed on a layer different from those of the first sensor patterns with the organic insulation layer disposed therebetween, wherein the first sensor patterns pass through the organic insulation layer and are connected to the first connecting patterns, and wherein the first sensor patterns are exposed through the inorganic insulation layer.

12. The electronic panel of claim 11, wherein:
the conductive pattern disposed on the organic insulation layer comprises the first sensor patterns, the second sensor patterns, and the second connecting patterns; and
the first connecting patterns are disposed between the organic insulation layer and the display unit.

13. The electronic panel of claim 11, wherein:
at least some of the first sensor patterns, the second sensor patterns, the first connecting patterns, and the second connecting patterns comprise mesh lines having a plurality of openings; and
the inorganic insulation layer exposes a top surface of the mesh lines and fills the openings.

14. The electronic panel of claim 11, wherein:
the display unit comprises a plurality of organic light emitting elements and an encapsulation layer covering the organic light emitting elements; and
the organic insulation layer is directly disposed on the encapsulation layer.

* * * * *